US012696672B2

(12) United States Patent
Ma et al.

(10) Patent No.: US 12,696,672 B2
(45) Date of Patent: Jul. 28, 2026

(54) DISPLAY MODULE AND DISPLAY DEVICE INCLUDING TRANSPARENT ADJUSTING LAYER

(71) Applicant: Wuhan Tianma Micro-Electronics Co., Ltd., Wuhan (CN)

(72) Inventors: Yangzhao Ma, Wuhan (CN); Meihong Wang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 377 days.

(21) Appl. No.: 18/241,563

(22) Filed: Sep. 1, 2023

(65) Prior Publication Data

US 2024/0431183 A1     Dec. 26, 2024

(30) Foreign Application Priority Data

Jun. 26, 2023     (CN) .......................... 202310764267.7

(51) Int. Cl.
H10K 59/80          (2023.01)
H10K 59/122          (2023.01)
(Continued)

(52) U.S. Cl.
CPC ....... H10K 59/8792 (2023.02); H10K 59/122 (2023.02); H10K 59/127 (2023.02); H10K 59/131 (2023.02); H10K 59/873 (2023.02); H10K 59/8793 (2023.02); H10K 77/111 (2023.02); *H10K 50/844* (2023.02); *H10K 59/12* (2023.02)

(58) Field of Classification Search
CPC ............. H10K 59/8792; H10K 59/122; H10K 59/127; H10K 59/131; H10K 59/873;
H10K 59/8793; H10K 59/12; H10K 59/875; H10K 50/844; H10K 77/111
See application file for complete search history.

(56) References Cited

U.S. PATENT DOCUMENTS

| | | | | |
|---|---|---|---|---|
| 2014/0070203 A1* | 3/2014 | Tanaka | ................... | H05B 33/10 |
| | | | | 257/40 |
| 2015/0048347 A1* | 2/2015 | Tokuda | .............. | H10K 59/8792 |
| | | | | 257/40 |

(Continued)

FOREIGN PATENT DOCUMENTS

| | | | | |
|---|---|---|---|---|
| CN | 212412086 U | 1/2021 | | |
| CN | 113325632 A | 8/2021 | | |
| CN | 108351702 B | * 11/2021 | ............ | H04M 1/725 |

*Primary Examiner* — Ida M Soward
(74) *Attorney, Agent, or Firm* — Anova Law Group, PLLC

(57)     ABSTRACT

A display module includes a substrate and a light-emitting unit disposed on a side of the substrate. The light-emitting unit includes an opening region and a non-opening region surrounding the opening region. The display module also includes a transparent adjusting layer disposed on a side of the light-emitting unit away from the substrate. The transparent adjusting layer includes a first region and a second region surrounding the first region. In a direction perpendicular to a plane of the substrate, the first region at least partially overlaps with the opening region, and the second region at least partially overlaps with the non-opening region. A working process of the display module includes an anti-peeping stage, and in the anti-peeping stage, the first region is transparent, and the second region is non-transparent.

21 Claims, 13 Drawing Sheets

(51) Int. Cl.
  *H10K 59/127*      (2023.01)
  *H10K 59/131*      (2023.01)
  *H10K 77/10*       (2023.01)
  *H10K 50/844*      (2023.01)
  *H10K 59/12*       (2023.01)

(56)                References Cited

U.S. PATENT DOCUMENTS

2016/0343992  A1*  11/2016  Kim ..................... H10K 59/873
2017/0062528  A1*   3/2017  Aoyama ................ H10K 59/38
2017/0154947  A1*   6/2017  Nakamura ......... H10K 59/8722
2018/0088705  A1*   3/2018  Takahashi ............ G06F 3/0446
2018/0233691  A1*   8/2018  Ajiki ................... H10K 50/814
2018/0294428  A1*  10/2018  Nishimura ....... H10K 59/80516
2021/0014982  A1*   1/2021  Bok ..................... H05K 5/0217
2021/0217822  A1*   7/2021  Zhu ..................... H10K 59/124
2022/0223818  A1*   7/2022  Ichikawa .............. H05B 33/02
2023/0180569  A1*   6/2023  Park .................... H10K 59/353
                                                      257/40

* cited by examiner

3005

100

Light
Source

A–A'

100

200

DISPLAY MODULE AND DISPLAY DEVICE INCLUDING TRANSPARENT ADJUSTING LAYER

CROSS-REFERENCE TO RELATED APPLICATION

This application claims the priority of Chinese patent application No. 202310764267.7, filed on Jun. 26, 2023, the entirety of which is incorporated herein by reference.

FIELD

The present disclosure generally relates to the field of display technology and, more particularly, relates to a display module and a display device.

BACKGROUND

With the development of technology, people are increasingly using devices equipped with display modules to handle work and daily tasks. The terminal device often has a substantially large viewing angle, allowing users from different viewing angles to access the displayed information. To prevent the displayed content of the display module from being viewed by others, the display module requires to have anti-peeping capabilities.

For a liquid crystal display module, anti-peeping technology mainly includes a white-state anti-peeping method and a black-state anti-peeping method. The white-state anti-peeping method is achieved by increasing the light leakage at a dark state and reducing the contrast at a wide viewing angle. The black-state anti-peeping is achieved by adding an anti-peeping film and a dimming film in the backlight to achieve the desired effect.

However, because the liquid crystal display module and the organic self-luminous display module have different structures, the aforementioned anti-peeping technology cannot be directly applied to the organic self-luminous display module. Therefore, how to provide a display module and a display device capable of implementing anti-peeping protection for the organic self-luminous display module is an urgent technical problem that needs to be solved.

SUMMARY

One aspect of the present disclosure provides a display module. The display module includes a substrate and a light-emitting unit disposed on a side of the substrate. The light-emitting unit includes an opening region and a non-opening region surrounding the opening region. The display module also includes a transparent adjusting layer disposed on a side of the light-emitting unit away from the substrate. The transparent adjusting layer includes a first region and a second region surrounding the first region. In a direction perpendicular to a plane of the substrate, the first region at least partially overlaps with the opening region, and the second region at least partially overlaps with the non-opening region. A working process of the display module includes an anti-peeping stage, and in the anti-peeping stage, the first region is transparent, and the second region is non-transparent.

Another aspect of the present disclosure provides a display device. The display device includes a display module. The display module includes a substrate and a light-emitting unit disposed on a side of the substrate. The light-emitting unit includes an opening region and a non-opening region surrounding the opening region. The display module also includes a transparent adjusting layer disposed on a side of the light-emitting unit away from the substrate. The transparent adjusting layer includes a first region and a second region surrounding the first region. In a direction perpendicular to a plane of the substrate, the first region at least partially overlaps with the opening region, and the second region at least partially overlaps with the non-opening region. A working process of the display module includes an anti-peeping stage, and in the anti-peeping stage, the first region is transparent, and the second region is non-transparent.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Various modifications and changes can be made to the embodiments of the present disclosure without departing from the spirit or scope of the present disclosure, which is apparent to those skilled in the art. Therefore, the present disclosure is intended to cover modifications and changes falling within the scope of the corresponding claims (the technical solutions to be protected) and their equivalents. It should be noted that the embodiments provided by the present disclosure can be combined with each other without contradiction.

Similar reference numbers and letters represent similar terms in the following Figures, such that once an item is defined in one Figure, it does not need to be further discussed in subsequent Figures.

Figure 1:
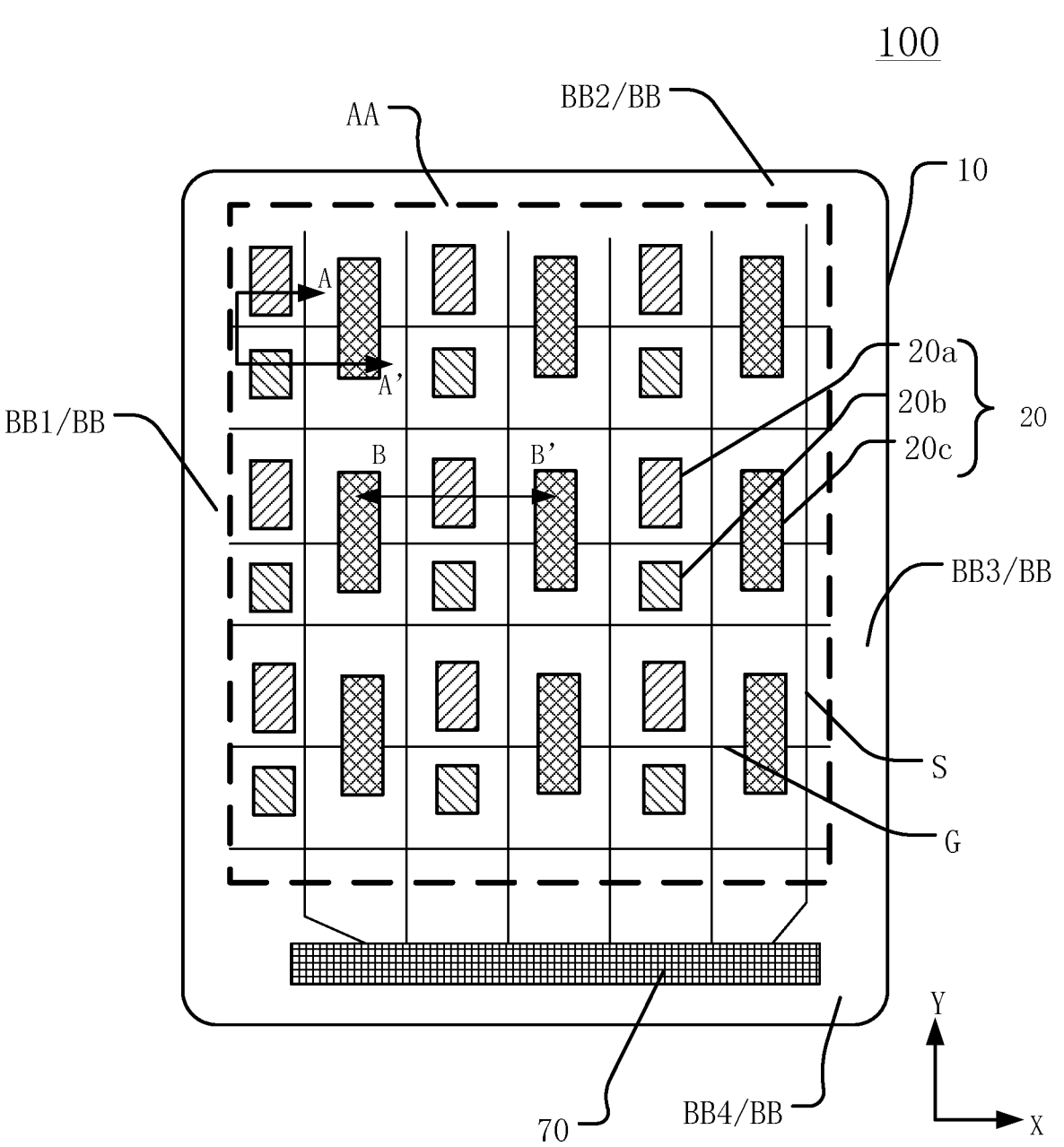
FIG. 1 illustrates a schematic diagram of a planar structure of an exemplary display module consistent with disclosed embodiments of the present disclosure.
Figure 2:
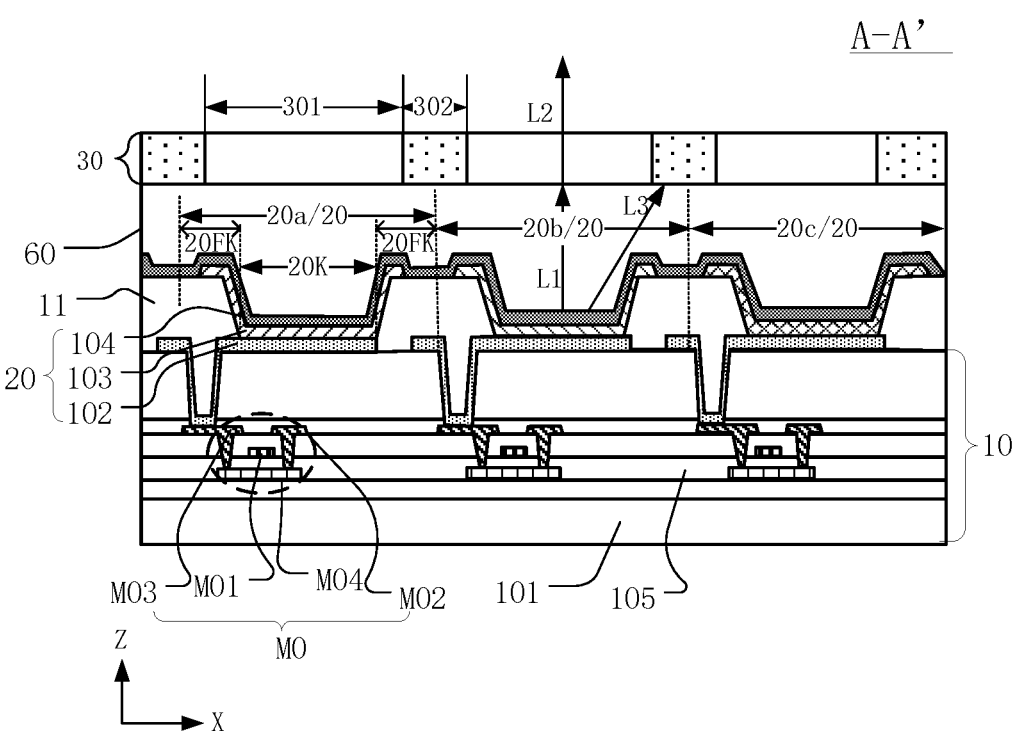
FIG. 2 illustrates a schematic A-A' sectional view of the display module in FIG. 1 consistent with disclosed embodiments of the present disclosure.

The present disclosure provides a display module. FIG. 1 illustrates a schematic diagram of a planar structure of a display module consistent with disclosed embodiments of the present disclosure; and FIG. 2 illustrates a schematic A-A' sectional view of the display module in FIG. 1, where the display module in FIG. 2 may be in an anti-peeling stage. Referring to FIG. 1 and FIG. 2, the display module 100 may include a substrate 10, and a light-emitting unit 20 disposed on a side of the substrate 10. The light-emitting unit 20 may include an opening region 20K and a non-opening region 20FK surrounding the opening region 20K. The display module 100 may also include a transparent adjusting layer 30 disposed on a side of the light-emitting unit 20 away from the substrate 10. The transparent adjusting layer 30 may include a first region 301 and a second region 302 surrounding the first region 301. In a direction perpendicular to the plane of the substrate 10, the first region 301 may at least partially overlap with the opening region 20K, and the second region 302 may at least partially overlap with the non-opening region 20FK. The working process of the display module 100 may include an anti-peeping stage, and in the anti-peeping stage, the first region 301 may be transparent, and the second region 302 may be non-transparent.

In one embodiment, the disclosed display module 100 may include an organic light-emitting display module. Referring to FIG. 1, the display module 100 may include a display region AA and a non-display region BB surrounding the display region AA. FIG. 1 may merely illustrate the case where the non-display region BB fully surrounds the display region AA, in certain embodiments, the non-display region BB may partially surround the display region AA, such as a waterdrop screen, which may not be limited by the present disclosure. The non-display region BB may include an upper frame and a lower frame that are disposed opposite to each other along a second direction Y. The lower frame may often be bonded with a driving chip 70. Alternatively, the lower frame may be directly bended to the backside (away from the light-emitting surface) of the display module 100, and after being bended, the lower frame may be bonded with a flexible circuit board and a driving chip 70 (not shown in the Figure). For illustrative purposes, FIG. 1 may merely illustrate that the lower frame is bonded with the driving chip 70 as an example.

Referring to FIG. 1, the display module 100 may further include a plurality of data lines S extended along the second direction Y and arranged along the first direction X, and a plurality of scan lines G extended along the first direction X and arranged along the second direction Y. Both the scan line G and the data line S may be located on the substrate 10. The driving chip 70 may provide a data voltage to the data line S, and the data voltage may be written into the driving circuit on the substrate 10 through the data line S. The specific structure of the driving circuit may not be specifically limited herein. In one embodiment, the driving circuit may include a 7T1C circuit, an 8T1C circuit, or a 16T1C circuit, where "T" may refer to a transistor, and "C" may refer to a storage capacitor.

Referring to FIG. 2, the substrate 10 may include a substrate base 101 and a driving transistor M0 disposed on a side of the substrate base 101 close to the light-emitting surface of the display module. The driving transistor M0 may include a gate M01, a source M02, and a drain M03. The substrate 10 may include the substrate base 101, an active layer M04, a first metal layer, a second metal layer, and a third metal layer that are disposed along a direction perpendicular to the display module 100, where the first metal layer, the second metal layer, and the third metal layer may not be labeled in the Figure. The driving transistor M0 may include the gate M01 located in the first metal layer, and the source M02 and the drain M03 that are located in the second metal layer. An insulating layer 105 may be formed between the first metal layer and the second metal layer, as well as between the second metal layer and the third metal layer. Pattern filling of the substrate base 101 and the insulating layer 105 may not be depicted in the Figure. Data lines S may be on the same layer as the third metal layer, and scan lines G may be on the same layer as the first metal layer.

The display module 100 may further include a plurality of light-emitting units 20 disposed on a side of the substrate 10. FIG. 1 illustrates a first light-emitting unit 20a, a second light-emitting unit 20b, and a third light-emitting unit 20c that are arranged along the first direction X. The first light-emitting unit 20a, the second light-emitting unit 20b, and the third light-emitting unit 20c may be arranged by any other method, which may not be specifically limited herein. Each light-emitting unit 20 may include an opening region 20K and a non-opening region 20FK. The opening region 20K of the light-emitting unit 20 may refer to a region where light is capable of being emitted, and the non-opening region 20FK may refer to a region where light is not capable of being emitted.

As shown in FIG. 2, any two adjacent light-emitting units 20 may be separated by a pixel definition layer 11. Adjacent two light-emitting units 20 may emit light with different colors. Each light-emitting unit 20 may include an anode 102, a cathode 104, and a light-emitting layer 103 located between the anode 102 and the cathode 104. In one embodiment, the light-emitting layer 103 may include a hole injection layer, a hole transport layer, a light-emitting material layer, a hole blocking layer, and an electron transport layer (not shown in FIG. 2) that are sequentially arranged along a direction pointing from the substrate 10 to the light-emitting unit 20.

The anode 102 may be made of various conductive materials. For example, the anode 102 may include a transparent electrode or a reflective electrode depending on the applications. When the anode 102 is a transparent electrode, the anode 102 may be made of a material including indium tin oxide, indium zinc oxide, zinc oxide, or indium oxide.

The pixel definition layer 11 may be made of an organic material, such as polyimide, polyamide, polyphenylene, acrylic resin, or phenolic resin. The pattern filling of the pixel definition layer 11 may not be depicted in the Figure.

The light-emitting layer 103 may be disposed over the anode 102, and the portion of the anode 102 on which the light-emitting layer 103 is disposed may not be covered by the pixel definition layer 11 and may be exposed. The light-emitting layer 103 may be formed through a vapor deposition process and may be patterned to correspond to each sub-pixel and the patterned anode 102. The light-emitting layer 103 may be made of an organic material with low molecular weight or an organic material with high molecular weight.

The cathode 104 may be disposed over the light-emitting layer 103. Similar to the anode 102, the cathode 104 may include a transparent electrode or a reflective electrode. The light-emitting layer 103 may include a hole injection layer on the substrate 10, a hole transport layer on the hole injection layer, a light-emitting material layer on the hole transport layer, a hole blocking layer on the light-emitting material layer, and an electron transport layer on the hole blocking layer. These layers may be formed through vapor deposition process. The light-emitting principle of the organic self-luminous display module may include that organic light-emitting materials emit light under electric field-driven carrier injection and recombination.

In one embodiment, the OLED display device may often use the indium tin oxide electrode and the metal electrode as the anode and cathode of the device, respectively. Under a certain voltage, electrons and holes may be injected from the cathode and anode into the electron transport layer and hole transport layer, respectively. Electrons and holes may migrate to the organic light-emitting layer 103 through the electron transport layer and the hole transport layer, respectively, and may meet in the organic light-emitting layer 103 and form excitons, which may excite the light-emitting molecules and may make the light-emitting molecules emit visible light through radiation relaxation. Referring to FIG. 2, the light-emitting layers 103 of the first light-emitting unit 20a, the second light-emitting unit 20b, and the third light-emitting unit 20c may be filled with different patterns to indicate that the emitting colors of different light-emitting units 20 are different.

Referring to FIG. 2, a cover plate may be provided on a side of the transparent adjusting layer 30 away from the substrate 10. The cover plate may be made of a rigid material or a flexible material. The rigid material may include glass, and the flexible material may include PET, which may not be specifically limited by the present disclosure.

In the present disclosure, the transparent adjusting layer 30 may be disposed on the side of the light-emitting unit 20 away from the substrate 10. The transparent adjusting layer 30 may include a first region 301 and a second region 302 surrounding the first region 301. The transparent adjusting layer 30 may be configured to prevent the light with a large angle from being emitted from the second region 302 during the anti-peeping stage. In the present disclosure, the large angle may refer to that the angle between a light-emitting direction and a third direction Z is substantially large, where the third direction Z may be the direction perpendicular to the plane of the display module 100. Referring to FIG. 2, an angle between the light L3 and the third direction Z may be substantially large. For example, the angle between the light-emitting direction and the third direction Z being greater than 30° or greater than 45° may refer to the large angle. During the anti-peeping stage, the light L3 may be blocked by the second region 302 and cannot be emitted from the second region. Therefore, the displayed content of the display module 100 may not be visible at a large viewing angle, thereby achieving the anti-peeping protection.

In one embodiment, in the direction perpendicular to the plane of the substrate 10, the first region 301 may partially overlap with the opening region 20K. In another embodiment, in the direction perpendicular to the plane of the substrate 10, the opening region 20K may be located within the first region 301. For illustrative purposes, FIG. 2 may merely illustrate an example where in the direction perpendicular to the plane of the substrate 10, the opening region 20K may be located within the first region 301.

In one embodiment, in the direction perpendicular to the plane of the substrate 10, the second region 302 may partially overlap with the non-opening region 20FK, or the second region 302 may be located within the non-opening region 20FK, or the non-opening region 20FK may be located within the second region 302. For illustrative purposes, FIG. 2 may merely illustrate an example where in the direction perpendicular to the plane of the substrate 10, the second region 302 may be located within the non-opening region 20FK.

The working process of the display module 100 may include an anti-peeping stage. In the anti-peeping stage, the first region 301 may be transparent, and the second region 302 may be non-transparent.

It should be noted that the anti-peeping stage may be initiated by the user. When the user needs anti-peeping protection, the user may make the display module 100 activate the anti-peeping stage with a single key press. After activating the anti-peeping stage with a single key press, the second region 302 may become non-transparent, and the light emitted from the light-emitting unit 20 with a large angle may be blocked by the second region 302. In the direction perpendicular to the plane of the substrate 10, the first region 301 may at least partially overlap with the opening region 20K, and the first region 301 may be transparent. When the light perpendicular to the plane of the substrate 10 passes through the first region 301 after being emitted from the opening region 20K of the light-emitting unit 20, the light may continue to be emitted from the first region 301 along the direction perpendicular to the plane of the substrate 10. Referring to FIG. 2, the light L1 with a normal viewing angle may emerge as light L2 after passing through the first region 301, such that the displayed content of the display module may be visible at the normal viewing angle.

It should be noted that the first region 301 may be transparent, no matter whether the display module 100 is in the anti-peeping stage or in the sharing stage, normal emission may not be affected, and thus the display may still function properly.

The disclosed display module may have following beneficial effects. The display module 100 may include the substrate 10, the light-emitting unit 20 disposed on a side of the substrate 10, and a transparent adjusting layer 30 disposed on the side of the light-emitting unit 20 away from the substrate 10. The light-emitting unit 20 may include the opening region 20K and the non-opening region 20FK. The light emitted from the light-emitting unit 20 may be emitted from the opening region 20K, to achieve display function. The transparent adjusting layer 30 may include the first region 301 and the second region 302 surrounding the first region 301. In the direction perpendicular to the plane of the substrate 10, the first region 301 may at least partially overlap with the opening region 20K, and the second region 302 may at least partially overlap with the non-opening region 20FK. In the anti-peeping stage, the first region 301 may be transparent, and the second region 302 may be non-transparent. The light perpendicular to the plane of the substrate 10 may pass through the first region 301 after being emitted from the opening region 20K of the light-emitting unit 20, to ensure normal display of the display module, and thus the displayed content of the display module may be visible at the normal viewing angle. At the same time, the second region 302 may be non-transparent, and the light with a large viewing angle emitted from the light-emitting unit 20 may be blocked by the second region 302, which may prevent the displayed content of the display module 100 from being visible at a large viewing angle, thereby achieving the anti-peeping protection. In the present disclosure, the transparent adjusting layer may be disposed on the side of the light-emitting unit away from the substrate, and in the anti-peeping stage, the first region 301 may be transparent, and the second region 302 may be non-transparent, thereby achieving the anti-peeping protection for an organic self-luminous display module.

Figure 3:
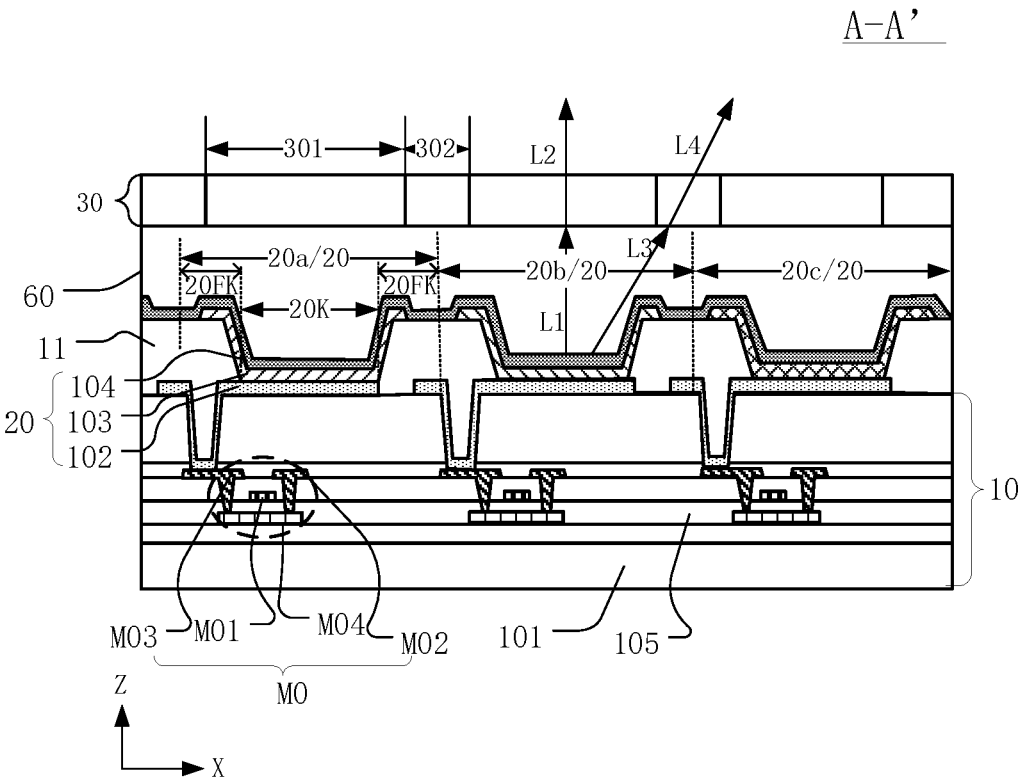
FIG. 3 illustrates another schematic A-A' sectional view of the display module in FIG. 1 consistent with disclosed embodiments of the present disclosure.

The working process of the display module 100 may further include a sharing stage. FIG. 3 illustrates another schematic A-A' sectional view of the display module in FIG. 1, and in FIG. 3, the display module may be in the sharing stage. In certain embodiments, referring to FIG. 3, in the sharing stage, both the first region 301 and the second region 302 may be transparent. In FIG. 3, the second region 302 may not be filled with a pattern, illustrating that the second region 302 is transparent during the sharing stage.

During the sharing stage, in the direction perpendicular to the plane of the substrate 10, the first region 301 may at least partially overlap with the opening region 20K, and the first region 301 may be transparent. When the light perpendicular to the plane of the substrate 10 passes through the first region 301 after being emitted from the opening region 20K of the light-emitting unit 20, the light may continue to be emitted from the first region 301 along the direction perpendicular to the plane of the substrate 10. Referring to FIG. 3, the light L1 with a normal viewing angle may emerge as light L2 after passing through the first region 301, such that the displayed content of the display module may be visible at the normal viewing angle. In the direction perpendicular to the plane of the substrate 10, the second region 302 may at least partially overlap with the non-opening region 20FK, and the second region 302 may be transparent. When passing through the second region 302, the light L3 with a substantially large angle with respect to the third direction Z may continue to be emitted from the second region 302 along the extension direction of light L3, which may allow the displayed content of the display module 100 to be visible at a large viewing angle during the sharing stage.

In the present disclosure, during the anti-peeping stage, the first region 301 may be transparent, and the second region 302 may be non-transparent. During the sharing stage, both the first region 301 and the second region 302 may be transparent. Specifically, during the anti-peeping stage, the first region 301 may be transparent, and the second region 302 may be non-transparent. The light perpendicular to the plane of the substrate 10 may pass through the first region 301 after being emitted from the opening region 20K of the light-emitting unit 20, to ensure normal display of the display module, and thus the displayed content of the display module may be visible at the normal viewing angle. At the same time, the second region 302 may be non-transparent, and the light with a large viewing angle emitted from the light-emitting unit 20 may be blocked by the second region 302, which may prevent the displayed content of the display module 100 from being visible at a large viewing angle, thereby achieving the anti-peeping protection.

During the sharing stage, the first region 301 may be transparent. When the light perpendicular to the plane of the substrate 10 passes through the first region 301 after being emitted from the opening region 20K of the light-emitting unit 20, the light may continue to be emitted from the first region 301 along the direction perpendicular to the plane of the substrate 10, such that the displayed content of the display module may be visible at the normal viewing angle. The second region 302 may be transparent. When passing through the second region 302, the light with a substantially large angle with respect to the third direction Z may continue to be emitted from the second region 302 along the extension direction of light, which may allow the displayed content of the display module to be visible at a large viewing angle, thereby achieving the sharing function.

Figure 4:
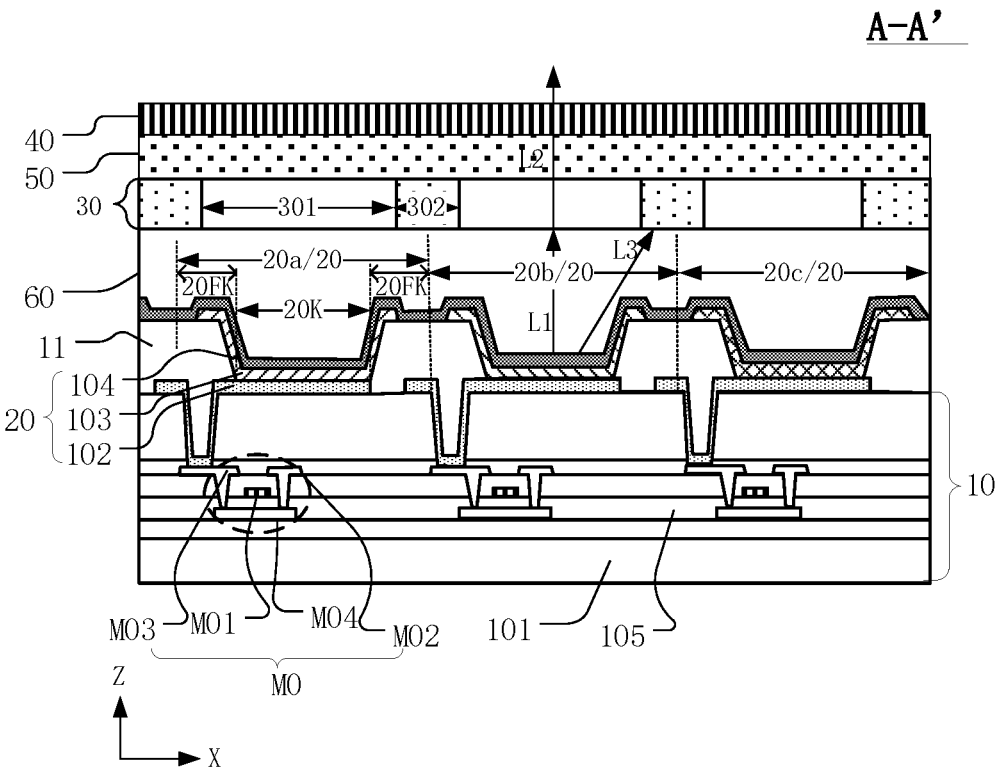
FIG. 4 illustrates another schematic A-A' sectional view of the display module in FIG. 1 consistent with disclosed embodiments of the present disclosure.
Figure 5:
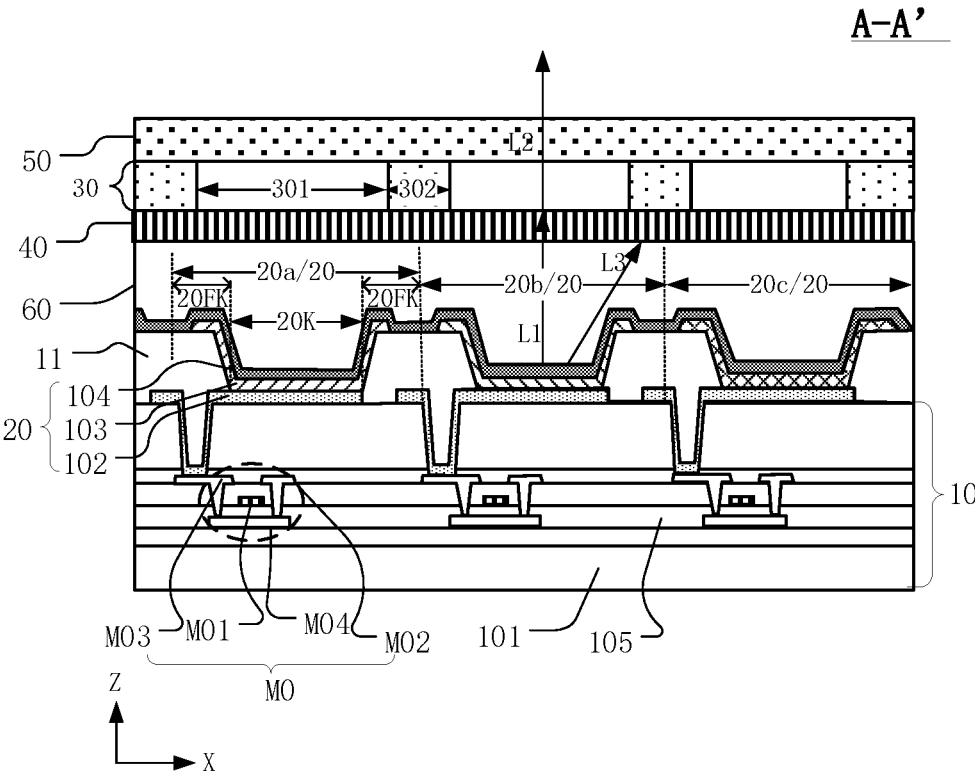
FIG. 5 illustrates another schematic A-A' sectional view of the display module in FIG. 1 consistent with disclosed embodiments of the present disclosure.
Figure 6:
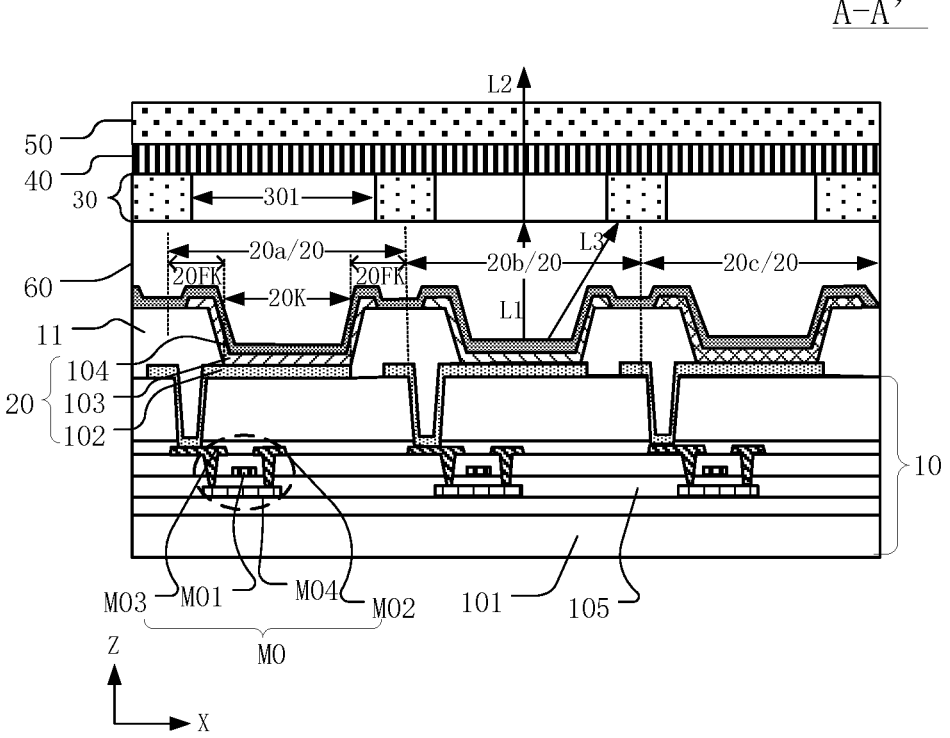
FIG. 6 illustrates another schematic A-A' sectional view of the display module in FIG. 1 consistent with disclosed embodiments of the present disclosure.

FIG. 4 illustrates another schematic A-A' sectional view of the display module in FIG. 1; FIG. 5 illustrates another schematic A-A' sectional view of the display module in FIG. 1; and FIG. 6 illustrates another schematic A-A' sectional view of the display module in FIG. 1. In certain embodiments, referring to FIG. 1 and FIGS. 4-6, the display module 100 may further include a polarizer 40 and a touch-control layer 50. The transparent adjusting layer 30 may be disposed on the side of the touch-control layer 50 away from the polarizer 40, or the transparent adjusting layer 30 may be disposed between the touch-control layer 50 and the polarizer 40, or the transparent adjusting layer 30 may be disposed on the side of the polarizer 40 away from the touch-control layer 50.

It should be noted that to meet user's requirements, the display module 100 may often have a touch-control function. In one embodiment, the display module 100 may include the touch-control layer 50, and the touch-control layer 50 may include a capacitive touch-control layer. The capacitive touch-control layer may include a sensing electrode and a transmitting electrode that are located in the same layer, and the sensing electrode may be electrically connected to the transmitting electrode through a bridge. Alternatively, the sensing electrode and the transmitting electrode of the capacitive touch-control layer may be disposed in different metal layers, which may not need to dispose the bridge. The structure of the touch-control layer 50 may not be specifically limited by the present disclosure.

It should be noted that the display module may require the polarizer 40, and the organic self-luminous display module may require the circular polarizer, which may be mainly configured to eliminate reflective light of the display module. In the present disclosure, the polarizer 40 may include a circular polarizer. In one embodiment, the circular polarizer may include a left-handed circular polarizer and a right-handed circular polarizer. The polarizer 40 may also include a left-handed circular polarizer and a right-handed circular polarizer. The left-handed circularly polarized light and the right-handed circularly polarized light may be generated from ordinary light by passing through the left-handed circular polarizer and the right-handed circular polarizer, respectively. Moreover, the left-handed circularly polarized light may merely pass through the left-handed circular polarizer, and the right-handed circularly polarized light may merely pass through the right-handed circular polarizer. When a mirror reflection is performed, the left-handed circularly polarized light may become right-handed circularly polarized light, and the right-handed circularly polarized light may become left-handed circularly polarized light. However, the rotation direction may remain the same.

The organic self-luminous display module may have many metal electrodes disposed therein, such as cathodes. The metal electrode may have a reflective effect. After entering into the display module, environmental light may cause strong reflection. When looking at the display module from the viewing side, the strong reflection may prevent the displayed content from being visible. Therefore, the circular polarizer 40 may be needed. When the environmental light incident into the display module passes through the circular polarizer, the environmental light may become circularly polarized light. After being reflected by the cathode, the circularly polarized light may change its rotation direction. When passing through the circular polarizer again, the circularly polarized light may be absorbed, thereby improving the contrast of the organic self-luminous display module in a bright environment.

In one embodiment, the relative position relationship between the transparent adjusting layer 30, the touch-control layer 50, and the polarizer 40 may include following three different configurations.

As shown in FIG. 4, the transparent adjusting layer 30 may be disposed on the side of the touch-control layer 50 away from the polarizer 40. The transparent adjusting layer 30 may be disposed on the side of the light-emitting unit 20 away from the substrate 10. The transparent adjusting layer 30, the touch-control layer 50, and the polarizer 40 may be stacked sequentially along a direction pointing from the substrate 10 towards the light-emitting unit 20.

As shown in FIG. 5, the transparent adjusting layer 30 may be disposed between the touch-control layer 50 and the polarizer 40. The polarizer 40 may be disposed on the side of the light-emitting unit 20 away from the substrate 10. The polarizer 40, the transparent adjusting layer 30, and the touch-control layer 50 may be stacked sequentially along the direction pointing from the substrate 10 towards the light-emitting unit 20.

As shown in FIG. 6, the transparent adjusting layer 30 may be disposed on the side of the polarizer 40 away from the touch-control layer 50. The transparent adjusting layer 30 may be disposed on the side of the light-emitting unit 20 away from the substrate 10. The transparent adjusting layer 30, the polarizer 40, and the touch-control layer 50 may be stacked sequentially along the direction pointing from the substrate 10 towards the light-emitting unit 20.

There are multiple variations in the positions of the polarizer 40, the transparent adjusting layer 30, and the touch-control layer 50, which may allow for product diversification.

For the embodiment associated with FIG. 4, the polarizer 40 may be disposed on the side of the touch-control layer 50 and the transparent adjusting layer 30 away from the substrate 10. The polarizer 40 may weaken or eliminate the reflective light from the light-emitting unit 20, the transparent adjusting layer 30, and the touch-control layer 50, thereby improving display performance.

For the embodiment associated with FIG. 5, the touch-control layer 50 may be closest to the light-emitting surface of the display module 100, which may enhance the touch-control detection sensitivity.

For the embodiment associated with FIG. 6, on the one hand, the touch-control layer 50 may be closest to the light-emitting surface of the display module 100, which may enhance the touch-control detection sensitivity. On the other hand, the polarizer 40 may be disposed on the side of the transparent adjusting layer 30 away from the substrate 10, which may weaken or eliminate reflective light from the light-emitting unit 20 and the transparent adjusting layer 30, thereby improving display performance.

In certain embodiments, referring to FIGS. 1-6, the display module 100 may further include an encapsulation layer 60 disposed on the side of the light-emitting unit 20 away from the substrate 10, and the transparent adjusting layer 30 may be disposed on the side of the encapsulation layer 60 away from the substrate 10.

It should be understood that the light-emitting layer 103 of the organic self-luminous display module may be made of an organic material, which may be damaged when being exposed to water and oxygen, and then the light-emitting unit 20 may fail. Therefore, it is necessary to encapsulate the light-emitting unit 20 by the encapsulation layer 60, to isolate the light-emitting unit 20 from water and oxygen.

In one embodiment, the encapsulation layer 60 may be disposed on the side of the cathode 104 away from the substrate 10, which may prevent water and oxygen from entering into the display module. In one embodiment, the encapsulation layer 60 may have a multilayer stacked structure including an inorganic encapsulation layer, an organic encapsulation layer, and an inorganic encapsulation layer. The specific structure of the encapsulation layer 60 may not be limited by the present disclosure. The encapsulation layer 60 may include multiple layers of inorganic encapsulation layer and multiple layers of organic encapsulation layer, which may be capable of providing desired protection to the light-emitting unit 20 within the display region AA. FIGS. 2-6 may roughly illustrate the position of the encapsulation layer 60, and may not serve as the actual product film layer structure of the encapsulation layer 60.

Figure 7:
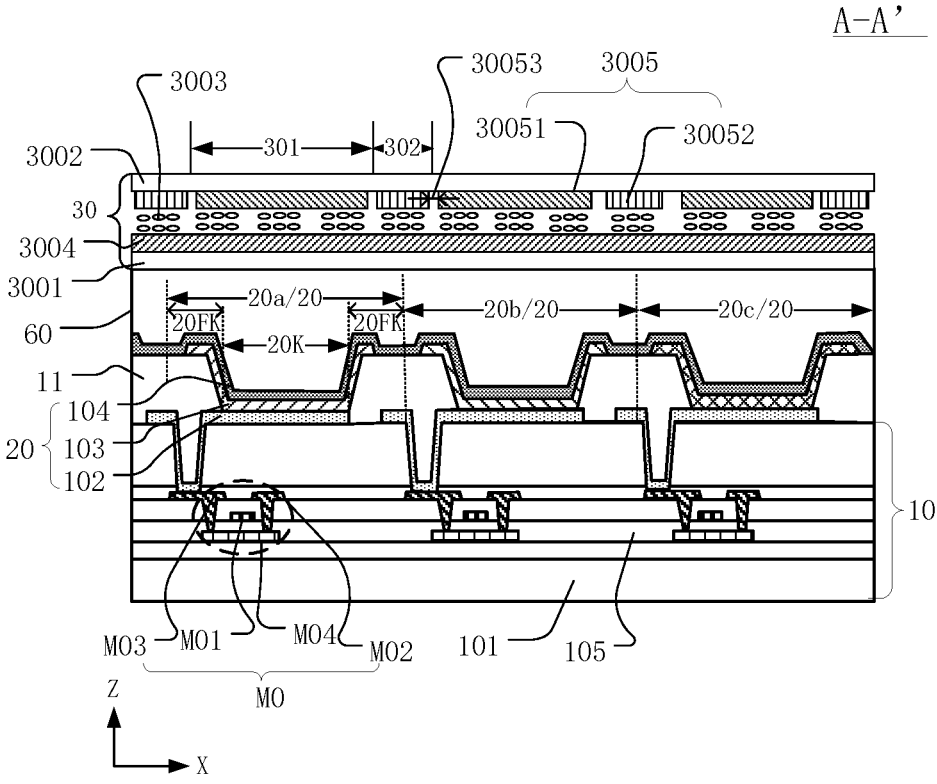
FIG. 7 illustrates another schematic A-A' sectional view of the display module in FIG. 1 consistent with disclosed embodiments of the present disclosure.
Figure 8:
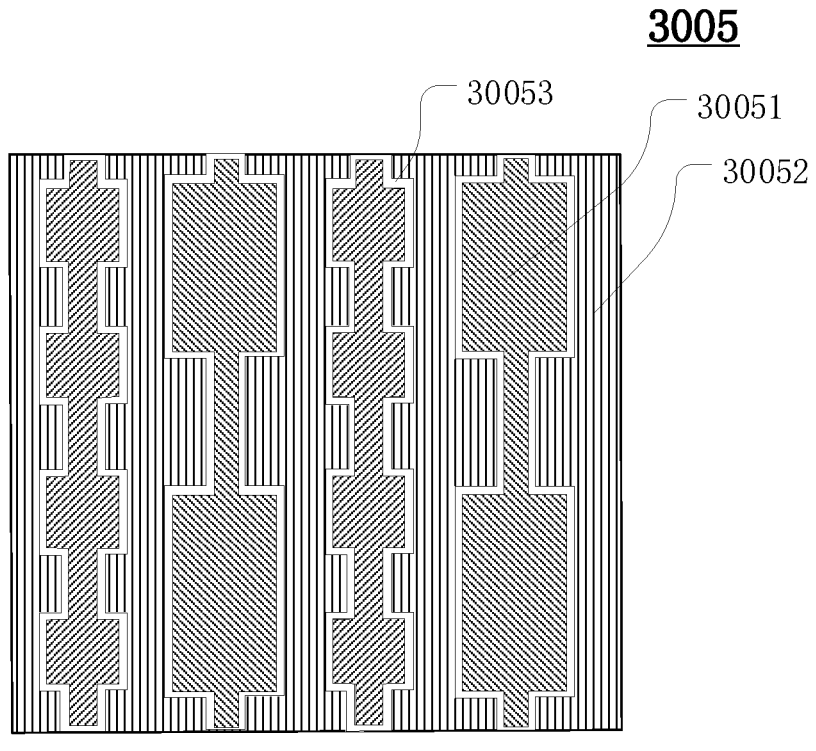
FIG. 8 illustrates a schematic diagram of a planar structure of a second electrode of an exemplary display panel consistent with disclosed embodiments of the present disclosure.
Figure 9:
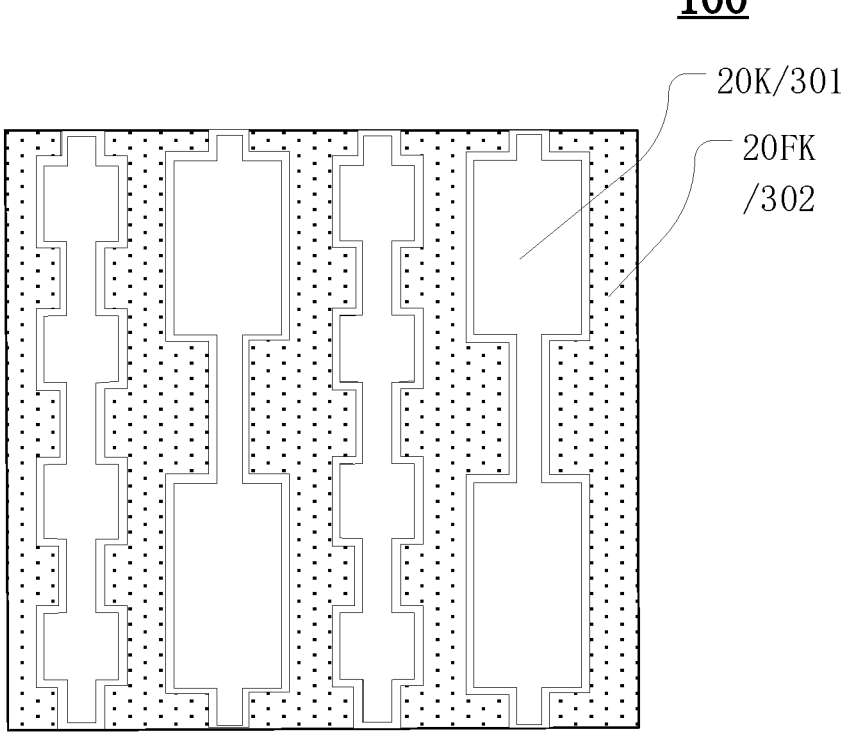
FIG. 9 illustrates a schematic diagram of a local planar structure of an exemplary display module in an anti-peeping stage consistent with disclosed embodiments of the present disclosure.
Figure 10:
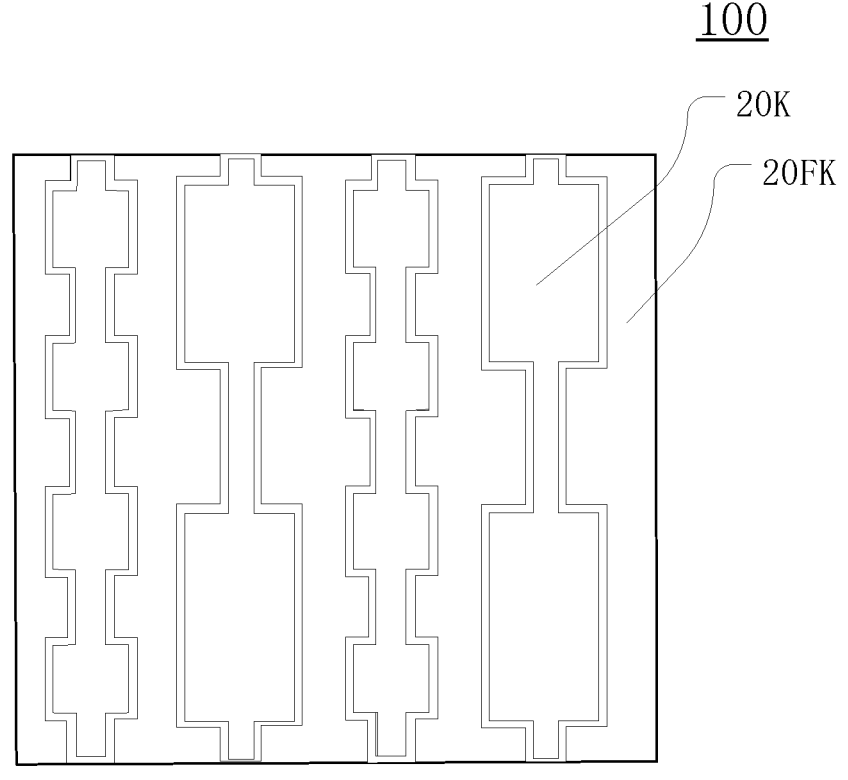
FIG. 10 illustrates a schematic diagram of a local planar structure of an exemplary display module in a sharing stage consistent with disclosed embodiments of the present disclosure.

FIG. 7 illustrates another schematic A-A' sectional view of the display module in FIG. 1; FIG. 8 illustrates a schematic diagram of a planar structure of a second electrode of a display panel; FIG. 9 illustrates a schematic diagram of a local planar structure of a display module in an anti-peeping stage; and FIG. 10 illustrates a schematic diagram of a local planar structure of a display module in a sharing stage.

In certain embodiments, referring to FIGS. 7-10, the transparent adjusting layer 30 may include a first substrate 3001 and a second substrate 3002 that are disposed opposite to each other, and a liquid crystal 3003 sandwiched between the first substrate 3001 and the second substrate 3002. The second substrate 3002 may be disposed on a side of the first substrate 3001 away from the substrate 10. A first electrode 3004 may be disposed on the side of the first substrate 3001 close to the liquid crystal 3003, and a second electrode 3005 may be disposed on the side of the second substrate 3002 close to the liquid crystal 3003. The second electrode 3005 may include a first sub-electrode 30051 and a second sub-electrode 30052. In the direction perpendicular to the plane of the substrate 10, the first sub-electrode 30051 may partially overlap with the opening region 20K, and the second sub-electrode 30052 may partially overlap with the non-opening region 20FK. The first sub-electrode 30051 and the second sub-electrode 30052 may be spaced apart by a gap 30053.

In the anti-peeping stage, an electric field may be formed between the first sub-electrode 30051 and the first electrode 3004, and electric field may not be formed between the second sub-electrode 30052 and the first electrode 3004.

In certain embodiments, both the first substrate 3001 and the second substrate 3002 may include a flexible substrate or glass. The first substrate 3001 and the second substrate 3002 may be made of a rigid material or a flexible material. The rigid material may include glass, and the flexible material may include PET. The specific materials of the first substrate 3001 and the second substrate 3002 may not be limited by the present disclosure, as long as the first substrate 3001 and the second substrate 3002 are made of a transparent material without affecting the light emission. The first substrate 3001 and the second substrate 3002 may not be filled with pattern in FIG. 7.

The first electrode 3004 may be disposed on the side of the first substrate 3001 close to the liquid crystal 3003, and the second electrode 3005 may be disposed on the side of the second substrate 3002 close to the liquid crystal 3003. The second electrode 3005 may include the first sub-electrode 30051 and the second sub-electrode 30052. The first electrode 3004 and the second electrode 3005 may be transparent electrodes. For example, each of the first electrode 3004 and the second electrode 3005 may be made of a material including silver oxide, aluminum oxide, tungsten oxide, magnesium oxide, molybdenum oxide, zinc oxide, tin oxide, indium oxide, chromium oxide, antimony oxide, titanium oxide, nickel oxide, copper oxide, vanadium oxide, cobalt oxide, iron oxide, niobium oxide, indium tin oxide, indium zinc oxide, aluminum-doped zinc oxide, aluminum-doped tin oxide, or antimony-doped tin oxide, which may not be limited herein. The first sub-electrode 30051 and the second sub-electrode 30052 may be made of a same material, while the first sub-electrode 30051 and the second sub-electrode 30052 may be spaced apart by the gap 30053 (as shown in FIG. 7 and FIG. 8). In the direction perpendicular to the plane of the substrate 10, the first sub-electrode 30051 may partially overlap with the opening region 20K, and the second sub-electrode 30052 may partially overlap with the non-opening region 20FK. In view of this, the first sub-electrode 30051 and the second sub-electrode 30052 may independently drive the liquid crystal 3003.

Figure 11:
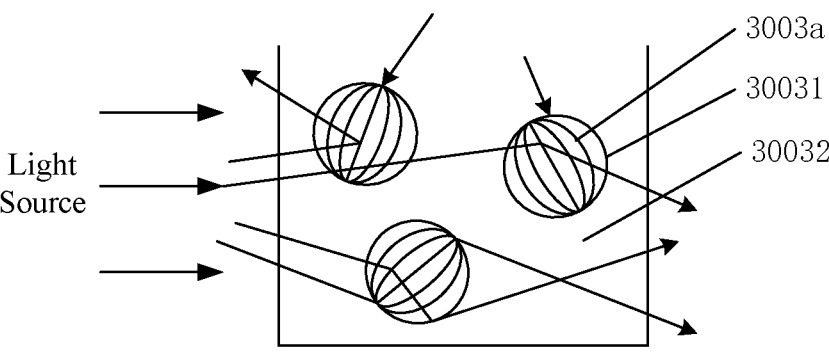
FIG. 11 illustrates a working principle diagram of a polymer liquid crystal in a state where an electric field is not applied.
Figures 12, 13:
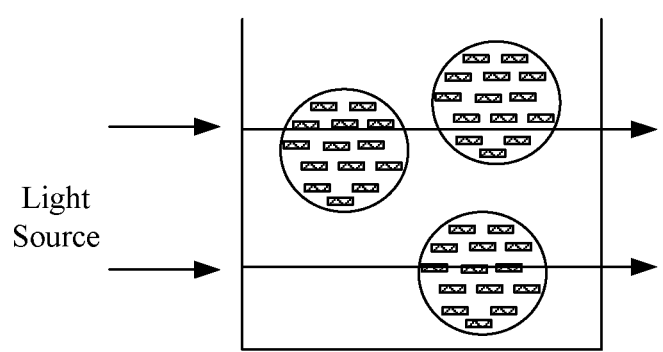
FIG. 12 illustrates a working principle diagram of a polymer liquid crystal in a state where an electric field is applied.
FIG. 13 illustrates another schematic A-A' sectional view of the display module in FIG. 1 consistent with disclosed embodiments of the present disclosure.

The liquid crystal 3003 may be disposed between the first substrate 3001 and the second substrate 3002. In one embodiment, the liquid crystal 3003 may include a polymer-dispersed liquid crystal (PDLC). FIG. 11 illustrates a working principle diagram of a polymer liquid crystal in a state where an electric field is not applied; and FIG. 12 illustrates a working principle diagram of a polymer liquid crystal in a state where an electric field is applied. Referring to FIG. 11 and FIG. 12, when the polymer-dispersed liquid crystal (PDLC) is used, the second region 302 of the transparent adjusting layer 30 may utilize the dielectric anisotropy of the polymer-dispersed liquid crystal to obtain the electro-optic response characteristic, which may be freely switched between a scattering state and a transparent state.

The polymer-dispersed liquid crystal (PDLC) may mix a droplet 30031 with polymer 30032. The droplet 30031 may include multiple low-molecular-weight liquid crystals 3003*a*, and the low-molecular-weight liquid crystals 3003*a* may be dispersed in multiple droplets 30031 by the polymer 30032. The low-molecular-weight liquid crystals 3003*a* may include nematic liquid crystal 3003 whose alignment can be changed through a vertical electric field between the first electrode 3004 and the second electrode 3005, which may not be limited by the present disclosure. In the absence of an electric field, the low-molecular-weight liquid crystals 3003*a* may freely align within the droplet 30031, and all droplets 30031 may be randomly arranged. Light may be scattered between the low-molecular-weight liquid crystals 3003*a* and the polymer 30032, to form a dark state. When an electric field is applied, the low-molecular-weight liquid crystals 3003*a* may align uniformly in a parallel manner. In view of this, the refractive index of the polymer 30032 may be consistent with the refractive index of the low-molecular-weight liquid crystals 3003*a*, and light may not be scattered between the polymer 30032 and the low-molecular-weight liquid crystals 3003*a*, to form a bright state.

For illustrative purposes, FIG. 9 and FIG. 10 illustrate the difference between the anti-peeping stage and the sharing stage by filling the non-opening region 20FK with different patterns. The first region 301 may remain transparent no matter whether in the anti-peeping stage or the sharing stage, and the second region 302 may be non-transparent in the anti-peeping stage and transparent in the sharing stage.

In the anti-peeping stage, corresponding to the opening region 20K, the light emitted from the light-emitting unit 20 may need to be capable of passing through the first region 301 of the transparent adjusting layer 30. An electric field may be formed between the first sub-electrode 30051 and the first electrode 3004, light may not be scattered between the polymer 30032 and the low-molecular-weight liquid crystals 3003*a* to form a bright state, and the light may pass through the first region 301 to achieve the display. Corresponding to the non-opening region 20FK, electric field may not be formed between the second sub-electrode 30052 and the first electrode 3004. In the absence of an electric field, the low-molecular-weight liquid crystals 3003*a* may freely align within the droplet 30031, and all droplets 30031 may be randomly arranged. Light may be scattered between the low-molecular-weight liquid crystals 3003*a* and the polymer 30032 to form a dark state, and the light with a large viewing angle may not pass through the second region 302 to achieve the anti-peeping protection.

In certain embodiments, referring to FIG. 7, FIG. 9, and FIG. 10, the working process of the display module 100 may also include a sharing stage. In the sharing stage, an electric field may be formed between the first sub-electrode 30051 and the first electrode 3004, and another electric field may be formed between the second sub-electrode 30052 and the first electrode 3004.

For the disclosed display module 100, in the anti-peeping stage, an electric field may be formed between the first sub-electrode 30051 and the first electrode 3004, and the first region 301 may become transparent. Electric field may not be formed between the second sub-electrode 30052 and the first electrode 3004, the second region 302 may be non-transparent. In the sharing stage, an electric field may be formed between the first sub-electrode 30051 and the first electrode 3004, and another electric field may be formed between the second sub-electrode 30052 and the first electrode 3004. Both the first region 301 and the second region 302 may be transparent.

In one embodiment, in the anti-peeping stage, corresponding to the opening region 20K, the light emitted from the light-emitting unit 20 may need to be capable of passing through the first region 301 of the transparent adjusting layer 30. An electric field may be formed between the first sub-electrode 30051 and the first electrode 3004, and light may not be scattered between the polymer 30032 and the low-molecular-weight liquid crystals 3003a to form a bright state. The light perpendicular to the plane of the substrate 10 may pass through the first region 301 after being emitted from the opening region 20K of the light-emitting unit 20, to ensure normal display of the display module and to enable the displayed content of the display module to be visible from the normal viewing angle, thereby achieving the display function. Corresponding to the non-opening region 20FK, electric field may not be formed between the second sub-electrode 30052 and the first electrode 3004. In the absence of an electric field, the low-molecular-weight liquid crystals 3003a may freely align within the droplet 30031, and all droplets 30031 may be randomly arranged. Light may be scattered between the low-molecular-weight liquid crystals 3003a and the polymer 30032 to form a dark state. The light with a large viewing angle emitted from the light-emitting unit may be blocked when passing through the second region 302, to make the displayed content of the display module 100 nonvisible from a large viewing angle, thereby achieving the anti-peeping protection.

In one embodiment, in the sharing stage, corresponding to the opening region 20K, the light emitted from the light-emitting unit 20 may need to be capable of passing through the first region 301 of the transparent adjusting layer 30. An electric field may be formed between the first sub-electrode 30051 and the first electrode 3004, and light may not be scattered between the polymer 30032 and the low-molecular-weight liquid crystals 3003a to form a bright state. The light perpendicular to the plane of the substrate 10 may pass through the first region 301 after being emitted from the opening region 20K of the light-emitting unit 20, to ensure normal display of the display module and to enable the displayed content of the display module to be visible from the normal viewing angle, thereby achieving the display function. Simultaneously, an electric field may be formed between the second sub-electrode 30052 and the first electrode 3004, and light may not be scattered between the polymer 30032 and the low-molecular-weight liquid crystals 3003a to form a bright state. The second region 302 may be transparent. When passing through the second region 302, the light with a substantially large angle with respect to the third direction Z may continue to be emitted from the second region 302 along the extension direction of light, which may allow the displayed content of the display module to be visible at a large viewing angle, thereby achieving the sharing function.

In certain embodiments, referring to FIG. 7, in the direction perpendicular to the plane of the substrate 10, the gap 30053 may overlap with the non-opening region 20FK.

It should be understood that the first sub-electrode 30051 and the second sub-electrode 30052 may need to be spaced apart by a gap 30053. In view of this, the first sub-electrode 30051 and the second sub-electrode 30052 may be insulated from each other, and the first sub-electrode 30051 and the second sub-electrode 30052 may be inputted with voltages respectively. When a voltage is applied to the first sub-electrode 30051, an electric field may be formed between the first sub-electrode 30051 and the first electrode 3004. When a voltage is applied to the second sub-electrode 30052, an electric field may be formed between the second sub-electrode 30052 and the first electrode 3004. During manufacturing, the entire second electrode layer 3005 may be first fabricated, and then the gap 30053 may be formed by etching to form the first sub-electrode 30051 and the second sub-electrode 30052. The position of the gap 30053 may not generate an electric field to drive the liquid crystal 3003 to deflect. When light emitted from the opening region 20K passes through the gap 30053, the light may not be able to be modulated. Therefore, in the direction perpendicular to the plane of the substrate 10, the gap 30053 may overlap with the non-opening region 20FK, which may not prevent the light emitted from the opening region 20K from being emitted from the display module.

FIG. 13 illustrates another schematic A-A' sectional view of the display module in FIG. 1. In certain embodiments, referring to FIG. 13, the first electrode 3004 may include a third sub-electrode 30041 and a fourth sub-electrode 30042. In the direction perpendicular to the plane of the substrate 10, the third sub-electrode 30041 may partially overlap with the first sub-electrode 30051, and the fourth sub-electrode 30042 may partially overlap with the second sub-electrode 30052.

In one embodiment, in the direction perpendicular to the plane of the substrate 10, the third sub-electrode 30041 may partially overlap with the first region 301, and the third sub-electrode 30041 may partially overlap with the first sub-electrode 30051. The fourth sub-electrode 30042 may partially overlap with the second region 302, and the fourth sub-electrode 30042 may partially overlap with the second sub-electrode 30052. The third sub-electrode 30041 and the first sub-electrode 30051 may be arranged opposite to each other along the third direction Z, and the fourth sub-electrode 30042 and the second sub-electrode 30052 may be arranged opposite to each other along the third direction Z.

Referring to FIG. 9 and FIG. 10, in the anti-peeping stage, corresponding to the opening region 20K, the light emitted from the light-emitting unit 20 may need to be capable of passing through the first region 301 of the transparent adjusting layer 30. An electric field may be formed between the first sub-electrode 30051 and the third sub-electrode 30041, and light may not be scattered between the polymer 30032 and the low-molecular-weight liquid crystals 3003a to form a bright state. The light perpendicular to the plane of the substrate 10 may pass through the first region 301 after being emitted from the opening region 20K of the light-emitting unit 20, to ensure normal display of the display module and to enable the displayed content of the display module to be visible from the normal viewing angle, thereby achieving the display function. Corresponding to the non-opening region 20FK, electric field may not be formed between the second sub-electrode 30052 and the fourth sub-electrode 30042. In the absence of an electric field, the low-molecular-weight liquid crystals 3003a may freely align within the droplet 30031, and all droplets 30031 may be randomly arranged. Light may be scattered between the low-molecular-weight liquid crystals 3003a and the polymer 30032 to form a dark state. The light with a large viewing angle may not be able to pass through the second region, thereby achieving the anti-peeping protection. The second region 302 may be non-transparent. The light with a large viewing angle emitted from the light-emitting unit 20 may be blocked when passing through the second region 302, to make the displayed content of the display module 100 nonvisible from a large viewing angle, thereby achieving the anti-peeping protection.

In the sharing stage, corresponding to the opening region 20K, the light emitted from the light-emitting unit 20 may need to be capable of passing through the first region 301 of the transparent adjusting layer 30. An electric field may be formed between the first sub-electrode 30051 and the third sub-electrode 30041, and light may not be scattered between the polymer 30032 and the low-molecular-weight liquid crystals 3003a to form a bright state. The light perpendicular to the plane of the substrate 10 may pass through the first region 301 after being emitted from the opening region 20K of the light-emitting unit 20, to ensure normal display of the display module and to enable the displayed content of the display module to be visible from the normal viewing angle, thereby achieving the display function. Simultaneously, an electric field may be formed between the second sub-electrode 30052 and the fourth sub-electrode 30042, and light may not be scattered between the polymer 30032 and the low-molecular-weight liquid crystals 3003a to form a bright state. The second region 302 may be transparent. When passing through the second region 302, the light with a substantially large angle with respect to the third direction Z may continue to be emitted from the second region 302 along the extension direction of light, which may allow the displayed content of the display module to be visible at a large viewing angle, thereby achieving the sharing function.

Figure 14:
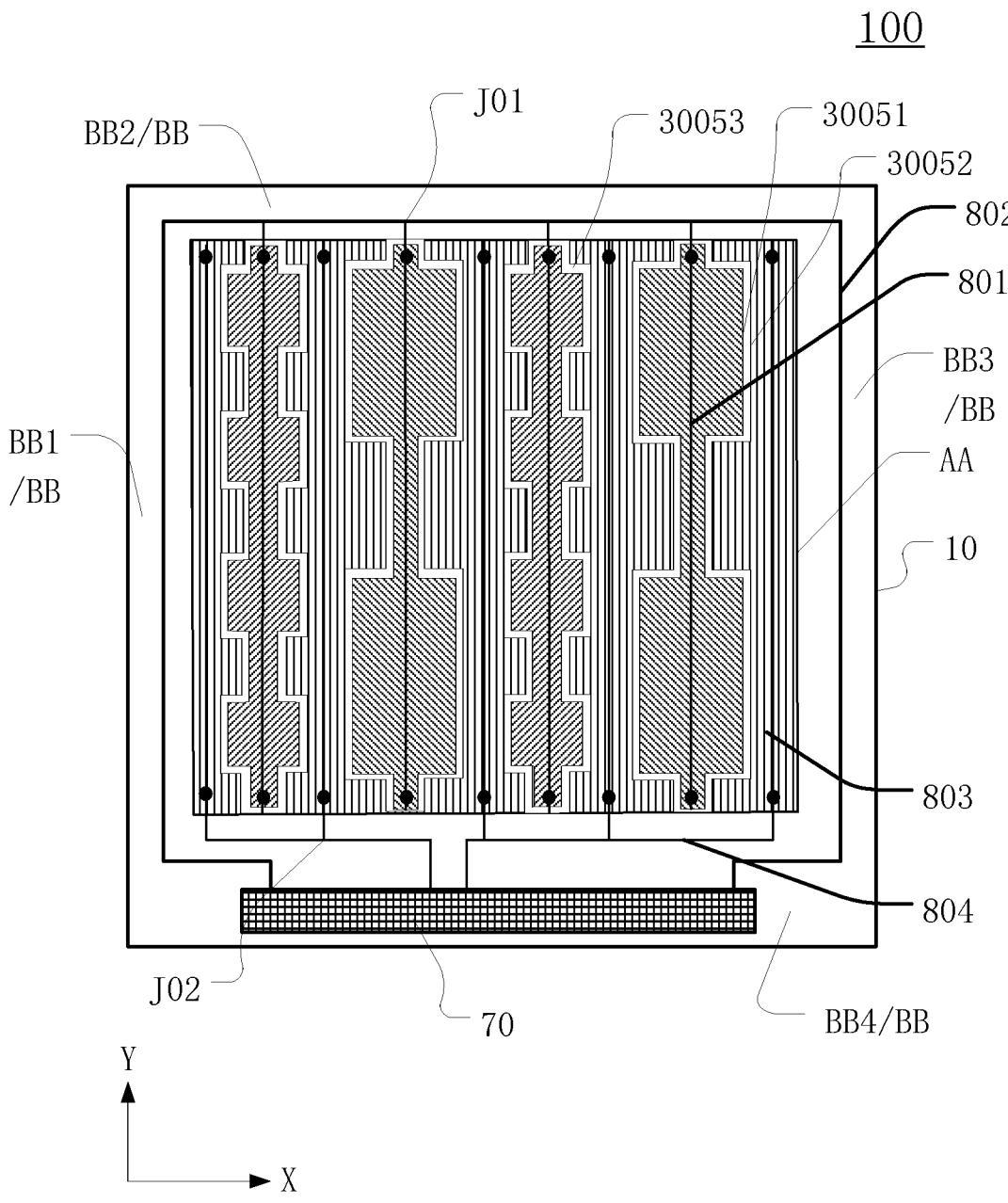
FIG. 14 illustrates a schematic diagram of a planar structure of another exemplary display module consistent with disclosed embodiments of the present disclosure.
Figure 15:
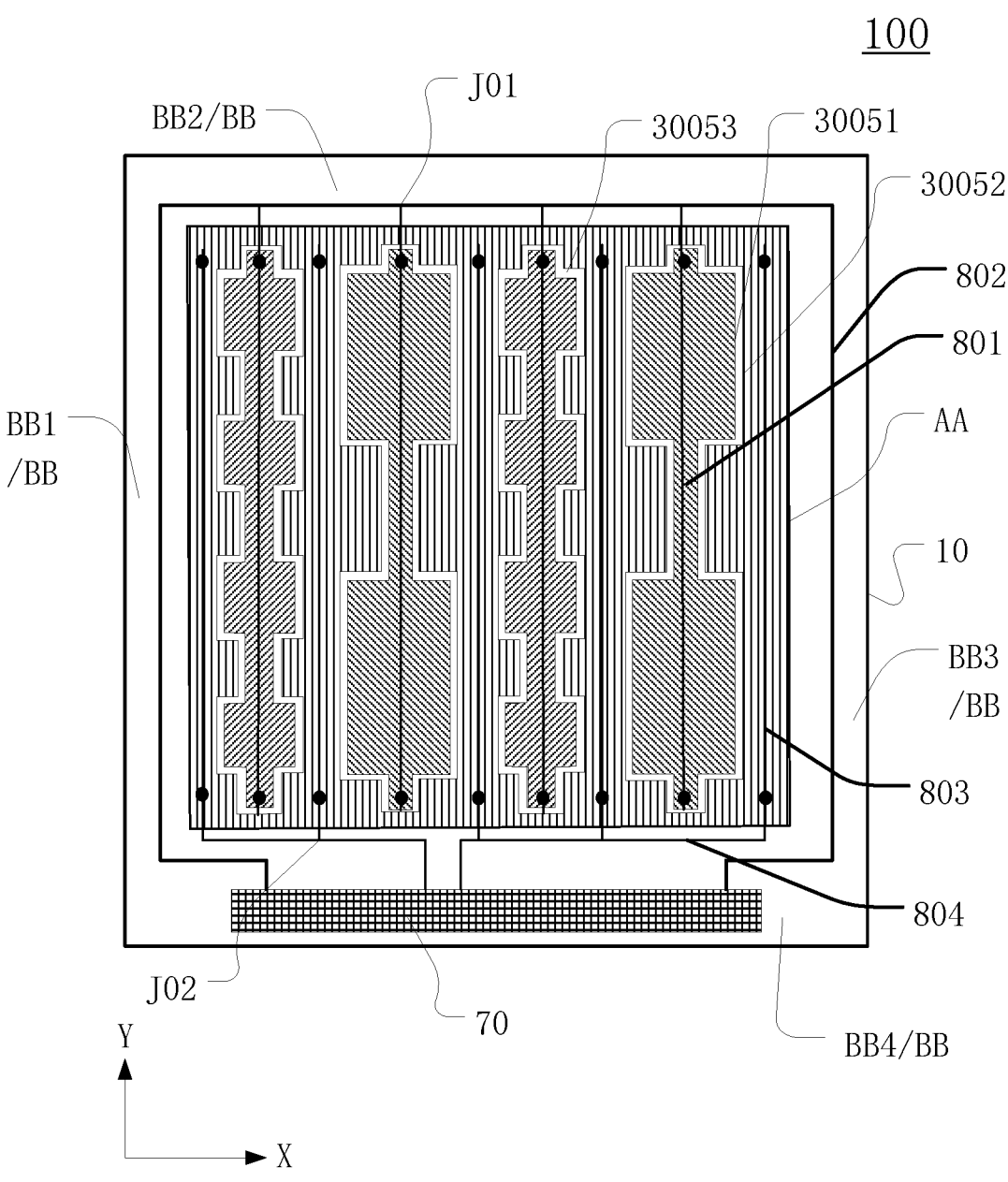
FIG. 15 illustrates a schematic diagram of a planar structure of another exemplary display module consistent with disclosed embodiments of the present disclosure.

FIG. 14 illustrates a schematic diagram of a planar structure of another display module consistent with disclosed embodiments of the present disclosure; and FIG. 15 illustrates a schematic diagram of a planar structure of another display module consistent with disclosed embodiments of the present disclosure. Referring to FIG. 14 and FIG. 15, FIG. 14 and FIG. 15 may not illustrate the light-emitting unit, and may merely illustrate the second electrode 3005. The display module 100 may further include a driving chip 70. Both the first sub-electrode 30051 and the second sub-electrode 30052 may be electrically connected to the driving chip 70.

In one embodiment, the display module 100 may include a display region and a non-display region at least partially surrounding the display region. The driving chip 70 may be mounted in the non-display region, e.g., located in a lower frame. The substrate 10 may include a wiring layer containing signal lines. The first sub-electrode 30051 may be electrically connected to the driving chip 70 through a signal line, and the second sub-electrode 30052 may be electrically connected to the driving chip 70 through a signal line. In one embodiment, the first sub-electrode 30051 and the signal line may be electrically connected through a vias, and the second sub-electrode 30052 and the signal line may be electrically connected through a vias.

Both the first sub-electrode 30051 and the second sub-electrode 30052 may be electrically connected to the driving chip 70. The driving chip 70 may transmit voltages to the first sub-electrode 30051 and the second sub-electrode 30052, respectively, to form an electric field between the first sub-electrode 30051 and the first electrode 3004 and to make the first region 301 transparent, and to form an electric field between the second sub-electrode 30052 and the first electrode 3004 and to make the second region 302 transparent.

In one embodiment, referring to FIG. 14, the second sub-electrode 30052 may partially surround the first sub-electrode 30051. In other words, the second electrode 3005 may include a plurality of second sub-electrodes 30052, and the plurality of second sub-electrodes 30052 may not be electrically connected to each other and may be insulated from each other. Referring to FIG. 15, the second sub-electrode 30052 may fully surround the first sub-electrode 30051. In other words, the second electrode 3005 may include one second sub-electrode 30052.

In certain embodiments, referring to FIG. 14 and FIG. 15, the display module may include the display region AA and the non-display region BB at least partially surrounding the display region AA. The display module 100 may further include a first signal line 801, a second signal line 802, a third signal line 803, and a fourth signal line 804.

The first signal line 801 may be at least partially located in the display region AA, and each of the plurality of first sub-electrodes 30051 may be electrically connected to the first signal line 801.

The second signal line 802 may be located in the non-display region BB. The second signal line 802 may be electrically connected to the driving chip 70 and the first signal line 801. A first connection point J01 between the first signal line 801 and the second signal line 802 may be located in the non-display region BB.

The third signal line 803 may be at least partially located in the display region AA, and each of the plurality of second sub-electrodes 30052 may be electrically connected to the third signal line 803.

The fourth signal line 804 may be located in the non-display region BB. The fourth signal line 804 may be electrically connected to the driving chip 70 and the third signal line 803. A second connection point J02 between the third signal line 803 and the fourth signal line 804 may be located in the non-display region BB.

Referring to FIG. 14 and FIG. 15, each first sub-electrode 30051 may be electrically connected in a one-to-one correspondence with the first signal line 801. In one embodiment, the first sub-electrode 30051 may be electrically connected to the first signal line 801 through a vias. Each second sub-electrode 30052 may be electrically connected in a one-to-one correspondence with the third signal line 803. In one embodiment, the second sub-electrode 30052 may be electrically connected to the third signal line 803 through a vias.

In one embodiment, the same one first signal line 801 may correspond to multiple vias, and the same one third signal line 803 may correspond to multiple vias. The larger the quantity of vias, the more stable the signal transmission.

FIG. 14 and FIG. 15 may illustrate the second signal line 802 and the fourth signal line 804. One end of the second signal line 802 may be electrically connected to the first signal line 801, and the other end of the second signal line 802 may be electrically connected to the driving chip 70. One end of the fourth signal line 804 may be electrically connected to the third signal line 803, and the other end of the second signal line 802 may be electrically connected to the driving chip 70. The driving chip 70 may provide a voltage for the first sub-electrode 30051 through the second signal line 802 and the first signal line 801. After the first sub-electrode 30051 receives the voltage signal, an electric field capable of driving the liquid crystal 3003 to deflect may be formed between the first sub-electrode 30051 and the first electrode 3004, which may make the first region 301 transparent. The driving chip 70 may provide a voltage for the second sub-electrode 30052 through the fourth signal line 804 and the third signal line 803. After the second sub-electrode 30052 receives the voltage signal, an electric field capable of driving the liquid crystal 3003 to deflect may be formed between the second sub-electrode 30052 and the first electrode 3004, which may make the second region 302 transparent. In the anti-peeping stage, the second region 302 may be non-transparent. In view of this, voltage may not be applied to the second sub-electrode 30052.

Figure 16:
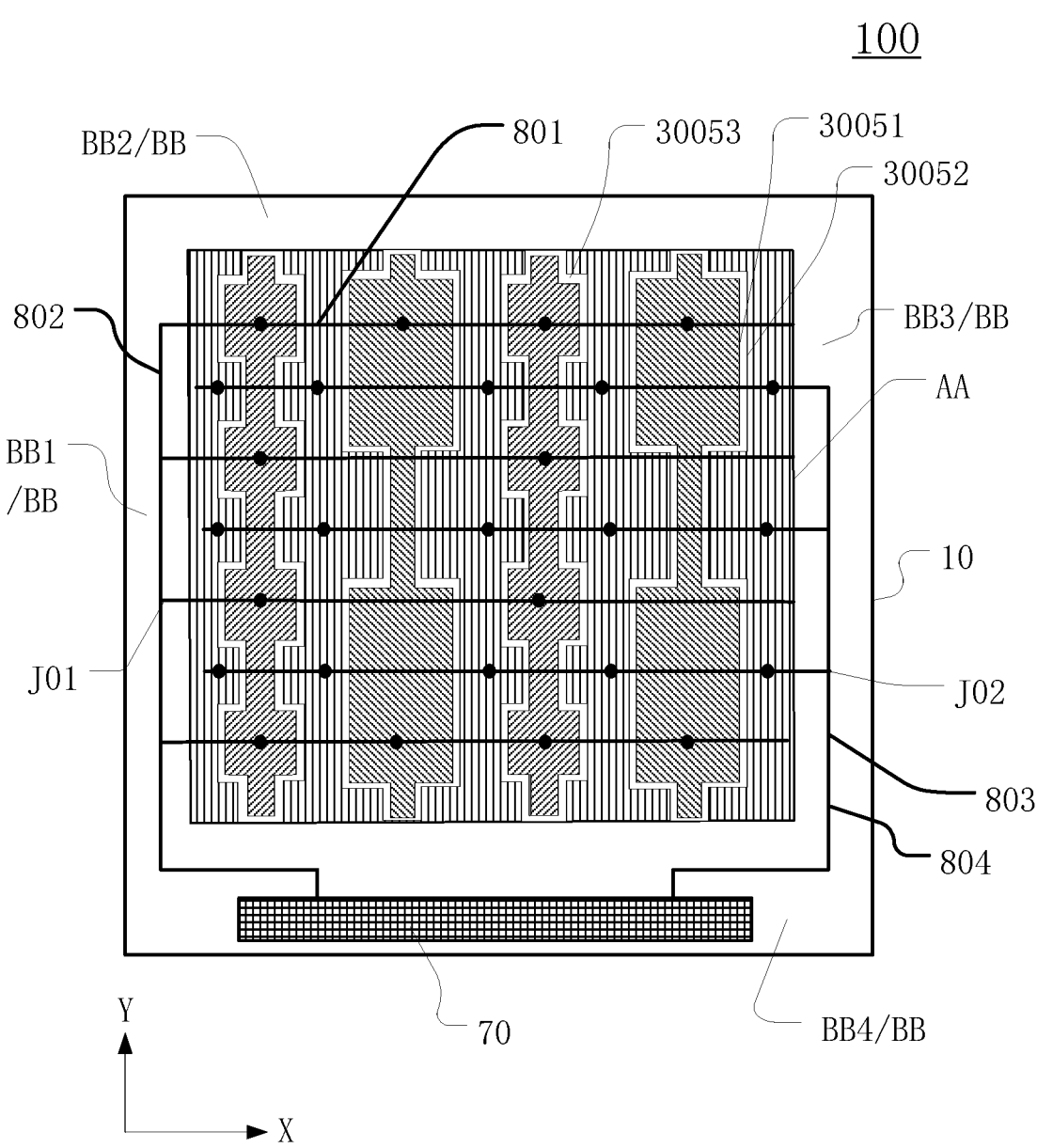
FIG. 16 illustrates a schematic diagram of a planar structure of another exemplary display module consistent with disclosed embodiments of the present disclosure.

FIG. 16 illustrates a schematic diagram of a planar structure of another display module consistent with disclosed embodiments of the present disclosure, where FIG. 16 may not illustrate the light-emitting unit 20 and may merely illustrate the second electrode 3005. In certain embodiments, referring to FIGS. 14-16, the non-display region BB may include the first non-display region BB1, the second non-display region BB2, the third non-display region BB3, and the fourth non-display region BB4. The first non-display region BB1 and the third non-display region BB3 may be disposed opposite to each other along the first direction X, and the second non-display region BB2 and the fourth non-display region BB4 may be disposed opposite to each other along the second direction Y.

The first connection point J01 may be located in the first non-display region BB1, and the second connection point J02 may be located in the third non-display region BB3. Alternatively, the first connection point J01 may be located in the second non-display region BB2, and the second connection point J02 may be located in the fourth non-display region BB4. FIGS. 14-16 illustrate that the non-display region may include the first non-display region BB1 and the third non-display region BB3 disposed opposite to each other along the first direction X, and the second non-display region BB2 and the fourth non-display region BB4 disposed opposite to each other along the second direction Y.

For illustrative purposes, referring to FIG. 16, the second sub-electrode 30052 may partially surround the first sub-electrode 30051 as an example. In FIG. 16, the first connection point J01 may be located in the first non-display region BB1, and the second connection point J02 may be located in the third non-display region BB3. In view of this, both the first signal line 801 and the third signal line 803 may be extended along the first direction X, while the second signal line 802 and the fourth signal line 804 may be located in the non-display region. The first connection point J01 between the first signal line 801 and the second signal line 802 may be located in the first non-display region BB1, and the second connection point J02 between the second signal line 802 and the fourth signal line 804 may be located in the third non-display region BB3. In other words, the first connection point J01 and the second connection point J02 may be disposed opposite to each other along the first direction X.

Referring to FIG. 14 and FIG. 15, the first connection point J01 may be located in the second non-display region BB2, and the second connection point J02 may be located in the fourth non-display region BB4. In view of this, both the first signal line 801 and the third signal line 803 may be extended along the second direction Y, and both the second signal line 802 and the fourth signal line 804 may be located in the non-display region. The first connection point J01 between the first signal line 801 and the second signal line 802 may be located in the second non-display region BB2, and the second connection point J02 between the second signal line 802 and the fourth signal line 804 may be located in the fourth non-display region BB4. In other words, the first connection point J01 and the second connection point J02 may be disposed opposite to each other along the second direction Y.

Figure 17:
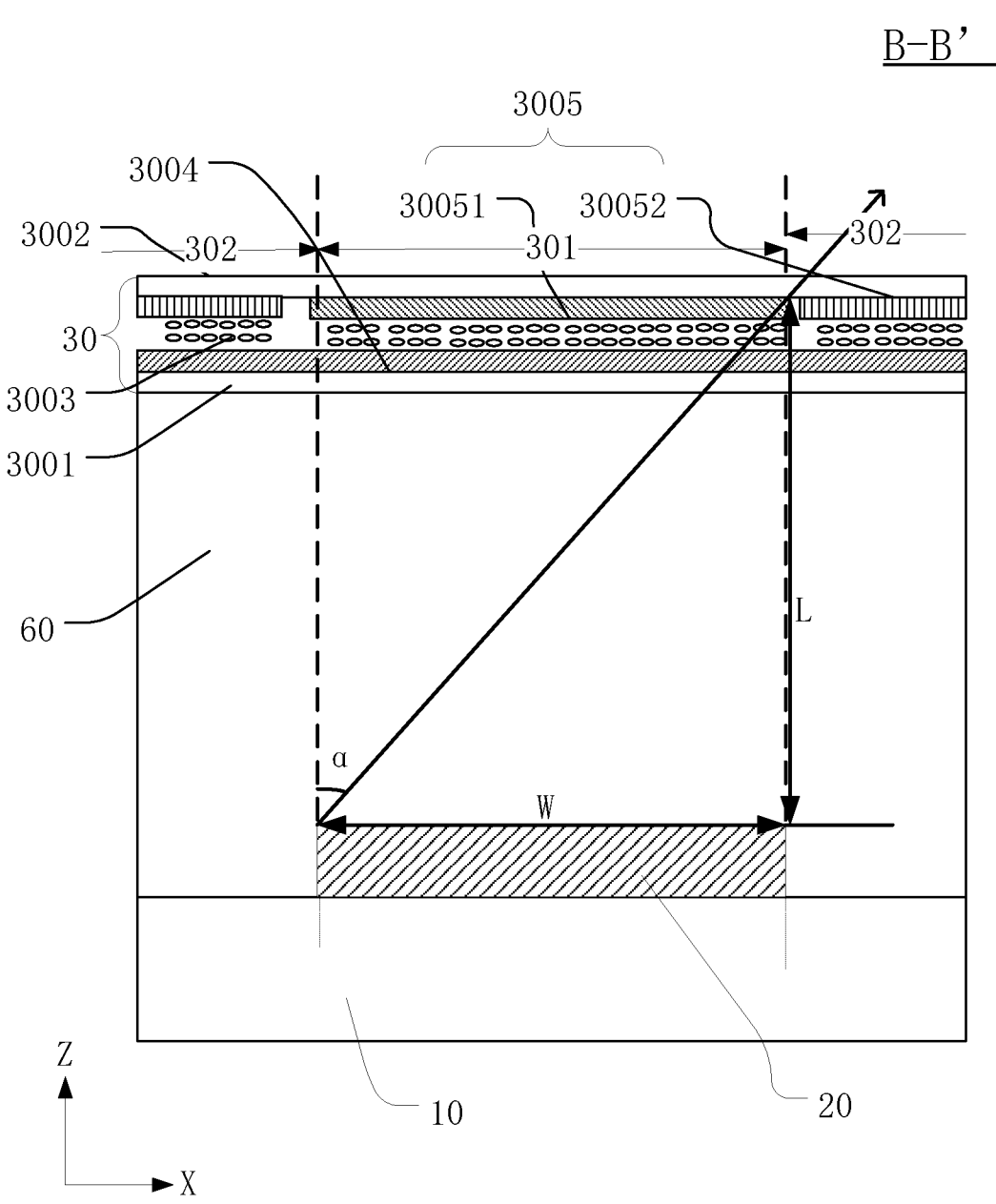
FIG. 17 illustrates another schematic B-B' sectional view of the display module in FIG. 1 consistent with disclosed embodiments of the present disclosure.

FIG. 17 illustrates another schematic B-B' sectional view of the display module in FIG. 1. In certain embodiments, referring to FIG. 17, the light adjusting layer 30 may include the first substrate 3001 and the second substrate 3002 that are disposed opposite to each other, and the liquid crystal 3003 sandwiched between the first substrate 3001 and the second substrate 3002. The second substrate 3002 may be located on the side of the first substrate 3001 away from the substrate 10. Along the direction perpendicular to the plane of the substrate 10, a minimum distance between the second substrate 3002 and the light-emitting surface of the light-emitting unit 20 may be denoted as "L", and a width of the light-emitting surface of the light-emitting unit 20 along the first direction X may be denoted as "W". The first direction X may be the direction pointing from the opening region 20K to the non-opening region 20FK, and $1 \geq W/L \geq \tan 30°$.

In the cross-sectional view of FIG. 17, certain film layers may be omitted, and the principle of achieving anti-peeping protection may not be repeated herein. In one embodiment, the liquid crystal 3003 may be disposed between the second substrate 3002 and the first substrate 3001. The minimum distance between the second substrate 3002 and the light-emitting surface of the light-emitting unit 20 may refer to the distance between the side of the second substrate 3002 close to the substrate 10 and the light-emitting surface of the light-emitting unit 20.

It should be understood that the light with a large viewing angle may refer to the light with an angle $\alpha$ greater than 45° with respect to the third direction Z. During the anti-peeping stage, the light that needs to be blocked may refer to the light with an angle greater than 45° with respect to the third direction Z. As shown in FIG. 17, $\tan \alpha = W/L$. When W/L is too large, the angle that needs to be blocked may be substantially large, which may not achieve effective anti-peeping protection. When W/L is too small, the angle that needs to be blocked may be substantially small, which may affect the normal display of the display module 100. Therefore, in a case of $1 \geq W/L \geq \tan 30°$, the light with a small viewing angle of the display module 100 may not be affected, and the light with an angle $\alpha$ greater than 45° may be blocked, thereby achieving the anti-peeping protection.

Figure 18:
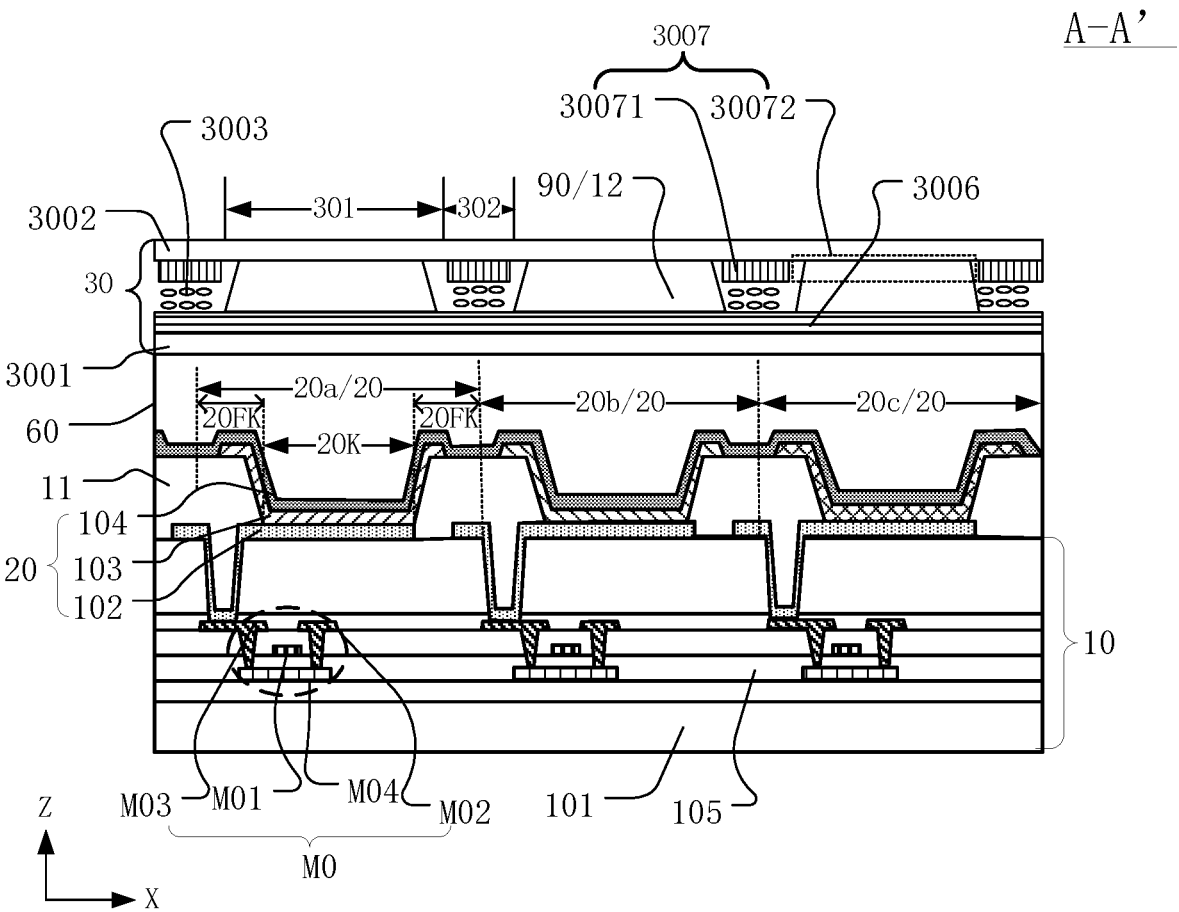
FIG. 18 illustrates another schematic A-A' sectional view of the display module in FIG. 1 consistent with disclosed embodiments of the present disclosure.

FIG. 18 illustrates another schematic A-A' sectional view of the display module in FIG. 1. In certain embodiments, referring to FIG. 18 and in conjunction with FIG. 11 and FIG. 12, the light adjusting layer 30 may include the first substrate 3001 and the second substrate 3002 that are disposed opposite to each other, as well as the liquid crystal 3003 and a transparent portion 90 that are sandwiched between the first substrate 3001 and the second substrate 3002. Along the direction perpendicular to the plane of the substrate 10, the transparent portion 90 may at least partially overlap with the opening region 20K, and the liquid crystal 3003 may at least partially overlap with the non-opening region 20FK.

In one embodiment, the second substrate 3002 may be located on the side of the first substrate 3001 away from the substrate 10, and the liquid crystal 3003 and the transparent portion 90 may be located between the first substrate 3001 and the second substrate 3002. The liquid crystal 3003 may correspond to the non-opening region 20FK, and the transparent portion 90 may correspond to the opening region 20K. The liquid crystal 3003 in the present disclosure may include a polymer-dispersed liquid crystal (PDLC).

It should be noted that the first region 301 may be transparent in both the anti-peeping stage and the sharing stage, and thus may correspond to the position of the opening region 20K. The transparent portion 90 may be disposed between the first substrate 3001 and the second substrate 3002. Moreover, because both the first substrate 3001 and the second substrate 3002 are transparent, the light adjusting layer 30 may be overall transparent at the position of the first region 301. Therefore, the light perpendicular to the plane of the substrate 10 may pass through the first region 301 after being emitted from the opening region 20K of the light-emitting unit 20, to ensure normal display of the display module and to make the displayed content of the display module visible at a normal viewing angle, thereby achieving the display function.

The second region 302 may be non-transparent during the anti-peeping stage. Therefore, at the position corresponding to the non-opening region 20FK, the liquid crystal 3003 may be disposed between the first substrate 3001 and the second substrate 3002. In the direction perpendicular to the plane of the substrate 10, the liquid crystal 3003 may partially overlap with the non-opening region 20FK. The liquid crystal 3003 may include a polymer liquid crystal. In the absence of an electric field, the low-molecular-weight liquid crystals 3003a may freely align within the droplet 30031, and all droplets 30031 may be randomly arranged. Light may be scattered between the low-molecular-weight liquid crystals 3003a and the polymer 30032, to form a dark state. The light with a large viewing angle emitted from the light-emitting unit 20 may be blocked when passing through the second region 302, to make the displayed content of the display module 100 nonvisible from a large viewing angle, thereby achieving the anti-peeping protection. When an electric field is applied, light may not be scattered between the polymer 30032 and the low-molecular-weight liquid crystals 3003a, to form a bright state. The second region 302 may be transparent. When passing through the second region 302, the light with a substantially large angle with respect to the third direction Z may continue to be emitted from the second region 302 along the extension direction of light, which may allow the displayed content of the display module to be visible at a large viewing angle, thereby achieving the sharing function.

In certain embodiments, referring to FIG. 18, the transmittance of the transparent portion 90 may be greater than 95%. It should be understood that the transparent adjusting layer 30 may be disposed on the side of the light-emitting unit 20 away from the substrate 10. The transmittance of the first region 301 may largely determine the light emission efficiency of the display module 100. Therefore, the greater the transmittance of the transparent portion 90, the higher the light emission efficiency of the display module 100. In the disclosed embodiments, the transmittance of the transparent portion 90 may be greater than 95%, to ensure normal display of the display module and to make the displayed content of the display module visible at a normal viewing angle, thereby ensuring display performance.

In certain embodiments, referring to FIG. 18, the transparent portion 90 may be made of an organic material. Optionally, the transparent portion 90 may be made of an organic material. Forming the transparent portion 90 may include coating an organic layer, exposure, and development. The organic material may prevent the first region 301 from being affected by the anti-peeping stage and the sharing stage, thereby achieving the display at a normal viewing angle.

In certain embodiments, referring to FIG. 18, the non-opening region 20FK may include a pixel definition layer 11. The transparent portion 90 may be made of a same material as the pixel definition layer 11. Alternatively, the transparent portion 90 may be made of an optical adhesive.

Referring to FIG. 18, the non-opening region 20FK may include the pixel definition layer 11. The pixel definition layer 11 may be made of an organic material including polyimide, polyamide, benzo-cyclobutene, acrylic resin, or phenolic resin. The transparent portion 90 may be made of the same material as the pixel definition layer 11, and thus the transparent portion 90 may not need to be formed by a separate material.

It should be understood that optical adhesive may be a common material used in the process of making display module 100, and may often be used to bond two film layers together. Additionally, optical adhesive may have a high light transmittance. The transparent portion 90 may be made of an optical adhesive, which may not only bond the first substrate 3001 and the second substrate 3002, but also ensure desired light transmittance.

In certain embodiments, referring to FIG. 18, supporting pillars 12 may be disposed between the first substrate 3001 and the second substrate 3002, and the supporting pillar 12 may be multiplexed as the transparent portion 90.

It should be understood that the liquid crystal 3003 may be disposed between the first substrate 3001 and the second substrate 3002.

The first substrate 3001, the second substrate 3002, and the liquid crystal 3003 may form a liquid crystal box. Supporting pillars 12 may be configured to ensure the thickness of the liquid crystal box. In view of this, the supporting pillars 12 may be multiplexed as the transparent portion 90, to support the liquid crystal box while ensuring the first region 301 to be transparent.

In certain embodiments, referring to FIG. 18 and in conjunction with FIGS. 11-12, a third electrode layer 3006 may be disposed on the side of the first substrate 3001 close to the liquid crystal 3003, and a fourth electrode layer 3007 may be disposed on the side of the second substrate 3002 close to the liquid crystal 3003. The fourth electrode layer 3007 may include a hollow region 30072 and a fourth electrode 30071 surrounding the hollow region 30072. In the direction perpendicular to the plane of the substrate 10, the hollow region 30072 may overlap with the opening region 20K, and the fourth electrode 30071 may overlap with the non-opening region 20FK.

Referring to FIG. 18, an entire layer of the third electrode layer 3006 may be disposed on the first substrate 3001, and the fourth electrode layer 3007 may be disposed on the second substrate 3002. The fourth electrode layer 3007 corresponding to the opening region 20K may refer to the hollow region 30072, and the fourth electrode layer 3007 corresponding to the non-opening region 20FK may refer to the fourth electrode 30071.

The first region 301 may be transparent in both the anti-peeping stage and the sharing stage, and thus may correspond to the position of the opening region 20K. The transparent portion 90 may be disposed between the first substrate 3001 and the second substrate 3002. The hollow region 30072 may be transparent. Therefore, the light adjusting layer 30 may be overall transparent at the position of the first region 301. The light perpendicular to the plane of the substrate 10 may pass through the first region 301 after being emitted from the opening region 20K of the light-emitting unit 20, to ensure normal display of the display module and to make the displayed content of the display module visible at a normal viewing angle, thereby achieving the display function.

The second region 302 may be non-transparent during the anti-peeping stage. Therefore, at the position corresponding to the non-opening region 20FK, the liquid crystal 3003 may be disposed between the first substrate 3001 and the second substrate 3002. In the direction perpendicular to the plane of the substrate 10, the liquid crystal 3003 may partially overlap with the non-opening region 20FK. The liquid crystal 3003 may include a polymer liquid crystal. When a voltage is not applied between the fourth electrode 30071 and the third electrode 3006, the low-molecular-weight liquid crystals 3003a may freely align within the droplet 30031, and all droplets 30031 may be randomly arranged. Light may be scattered between the low-molecular-weight liquid crystals 3003a and the polymer 30032, to form a dark state. The light with a large viewing angle emitted from the light-emitting unit 20 may be blocked when passing through the second region 302, to make the displayed content of the display module 100 nonvisible from a large viewing angle, thereby achieving the anti-peeping protection. When a voltage is applied between the fourth electrode 30071 and the third electrode 3006, light may not be scattered between the polymer 30032 and the low-molecular-weight liquid crystals 3003a, to form a bright state. The second region 302 may be transparent. When passing through the second region 302, the light with a substantially large angle with respect to the third direction Z may continue to be emitted from the second region 302 along the extension direction of light, which may allow the displayed content of the display module to be visible at a large viewing angle, thereby achieving the sharing function.

In certain embodiments, referring to FIG. 18, in the direction perpendicular to the plane of the substrate 10, the opening region 20K may be located within the transparent portion 90.

In one embodiment, in the direction perpendicular to the plane of the substrate 10, an area of the opening region 20K may be smaller than an area of the transparent portion 90, which may ensure that the light emitted from the opening region 20K is capable of passing through the transparent portion 90. Moreover, in the direction perpendicular to the plane of the substrate 10, the opening region 20K may be located within the transparent portion 90, which may ensure that in the sharing stage, the impact of the transparent portion 90 on the light with a large viewing angle may be reduced.

Figure 19:
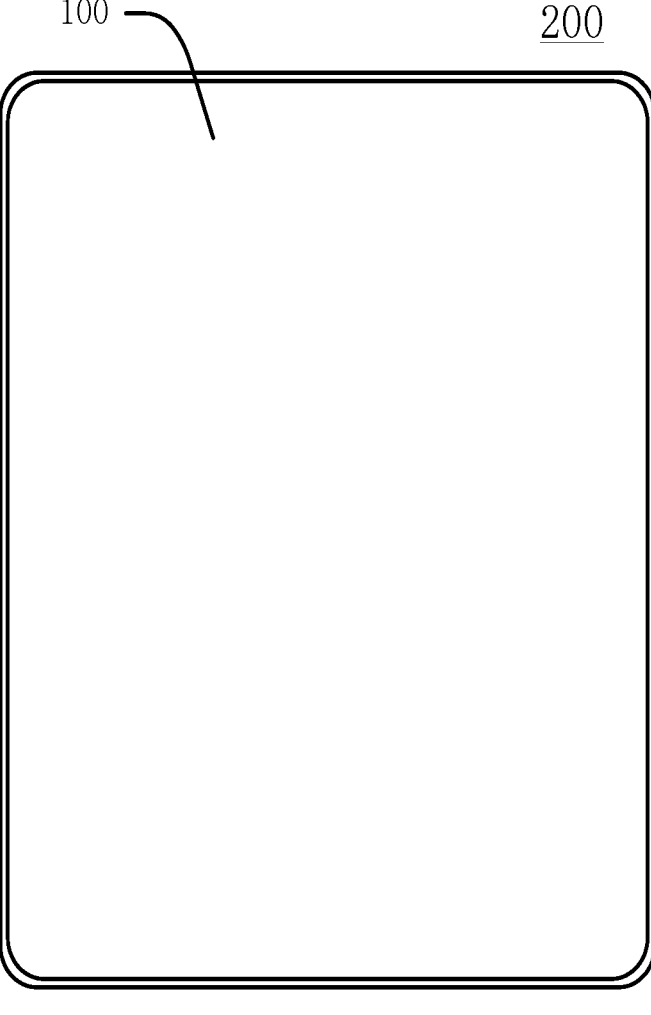
FIG. 19 illustrates a schematic diagram of an exemplary display device consistent with disclosed embodiments of the present disclosure.

The present disclosure also provides a display device. FIG. 19 illustrates a schematic diagram of a display device consistent with disclosed embodiments of the present disclosure. Referring to FIG. 19, the display device 200 may include the display module 100 described in any one of the disclosed embodiments of the present disclosure. FIG. 19 may merely use a mobile phone to describe the display device 200 as an example. It should be understood that the display device 200 in the disclosed embodiments may be any other display device with a display function, such as a computer, a TV, a e-paper, and a car display device, etc., which may not be limited by the present disclosure. The display device 200 may have the beneficial effects of disclosed display module 100, which may not be repeated herein.

The disclosed display module and display device may have following beneficial effects. The display module may include the substrate, the light-emitting unit disposed on a side of the substrate, and a transparent adjusting layer disposed on the side of the light-emitting unit away from the substrate. The light-emitting unit may include the opening region and the non-opening region surrounding the non-opening region. The light emitted from the light-emitting unit may be emitted from the opening region, to achieve display function. The transparent adjusting layer may include the first region and the second region surrounding the first region. In the direction perpendicular to the plane of the substrate, the first region may at least partially overlap with the opening region, and the second region may at least partially overlap with the non-opening region. In the anti-peeping stage, the first region may be transparent, and the second region may be non-transparent. The light perpendicular to the plane of the substrate may pass through the first region after being emitted from the opening region of the light-emitting unit, to ensure normal display of the display module, and thus the displayed content of the display module may be visible at the normal viewing angle. At the same time, the second region may be non-transparent, and the light with a large viewing angle emitted from the light-emitting unit may be blocked by the second region, which may prevent the displayed content of the display module from being visible at a large viewing angle, thereby achieving the anti-peeping protection. In the present disclosure, the transparent adjusting layer may be disposed on the side of the light-emitting unit away from the substrate, and in the anti-peeping stage, the first region may be transparent, and the second region may be non-transparent, thereby achieving the anti-peeping protection for an organic self-luminous display module.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display module, comprising:
   a substrate;
   a light-emitting unit disposed on a side of the substrate, wherein the light-emitting unit includes an opening region and a non-opening region surrounding the opening region; and
   a transparent adjusting layer disposed on a side of the light-emitting unit away from the substrate, wherein:
       the transparent adjusting layer includes a first substrate and a second substrate that are disposed opposite to each other, and a liquid crystal sandwiched between the first substrate and the second substrate,
       the transparent adjusting layer includes a first region and a second region surrounding the first region,
       in a direction perpendicular to a plane of the substrate, the first region at least partially overlaps with the opening region, and the second region at least partially overlaps with the non-opening region, and
       a working process of the display module includes an anti-peeping stage, and in the anti-peeping stage, the first region is transparent, and the second region is non-transparent.

2. The display module according to claim 1, wherein:
   the working process of the display module further includes a sharing stage, and in the sharing stage, both the first region and the second region are transparent.

3. The display module according to claim 1, further including:
   a polarizer and a touch-control layer, wherein:
       the transparent adjusting layer is disposed on a side of the touch-control layer away from the polarizer, or
       the transparent adjusting layer is disposed between the touch-control layer and the polarizer, or the transparent adjusting layer is disposed on a side of the polarizer away from the touch-control layer.

4. The display module according to claim 1, further including:

an encapsulation layer disposed on the side of the light-emitting unit away from the substrate, wherein the transparent adjusting layer is disposed on a side of the encapsulation layer away from the substrate.

5. The display module according to claim 1, wherein:

the second substrate is disposed on a side of the first substrate away from the substrate, a first electrode is disposed on a side of the first substrate close to the liquid crystal;

a second electrode is disposed on a side of the second substrate close to the liquid crystal;

the second electrode includes a first sub-electrode and a second sub-electrode;

in the direction perpendicular to the plane of the substrate, the first sub-electrode partially overlaps with the opening region, and the second sub-electrode partially overlaps with the non-opening region;

the first sub-electrode and the second sub-electrode are spaced apart by a gap; and in the anti-peeping stage, an electric field is formed between the first sub-electrode and the first electrode, and the electric field is not formed between the second sub-electrode and the first electrode.

6. The display module according to claim 5, wherein:

the working process of the display module further includes a sharing stage, and in the sharing stage, an electric field is formed between the first sub-electrode and the first electrode, and another electric field is formed between the second sub-electrode and the first electrode.

7. The display module according to claim 5, wherein:

in the direction perpendicular to the plane of the substrate, the gap overlaps with the non-opening region.

8. The display module according to claim 5, wherein:

the first electrode includes a third sub-electrode and a fourth sub-electrode, wherein in the direction perpendicular to the plane of the substrate, the third sub-electrode partially overlaps with the first sub-electrode, and the fourth sub-electrode partially overlaps with the second sub-electrode.

9. The display module according to claim 7, further including:

a driving chip, wherein both the first sub-electrode and the second sub-electrode are electrically connected to the driving chip.

10. The display module according to claim 9, further including:

a display region and a non-display region at least partially surrounding the display region;

a first signal line at least partially located in the display region, wherein each first sub-electrode is electrically connected to the first signal line;

a second signal line located in the non-display region, wherein the second signal line is electrically connected to the driving chip and the first signal line, and a first connection point between the first signal line and the second signal line is located in the non-display region;

a third signal line at least partially located in the display region, wherein each second sub-electrode is electrically connected to the third signal line; and a fourth signal line located in the non-display region, wherein the fourth signal line is electrically connected to the driving chip and the third signal line, and a second connection point between the third signal line and the fourth signal line is located in the non-display region.

11. The display module according to claim 10, wherein:

the non-display region includes a first non-display region, a second non-display region, a third non-display region, and a fourth non-display region, wherein:

the first non-display region and the third non-display region are disposed opposite to each other along a first direction, and the second non-display region and the fourth non-display region are disposed opposite to each other along a second direction, and the first connection point is located in the first non-display region, and the second connection point is located in the third non-display region, or the first connection point is located in the second non-display region, and the second connection point is located in the fourth non-display region.

12. The display module according to claim 1, wherein:

the second substrate is located on a side of the first substrate away from the substrate; and along the direction perpendicular to the plane of the substrate, a minimum distance between the second substrate and a light-emitting surface of the light-emitting unit is denoted as "L", and a width of the light-emitting surface of the light-emitting unit along a first direction is denoted as "W", wherein the first direction is a direction pointing from the opening region towards the non-opening region, and $1 \geq W/L \geq \tan 30°$.

13. The display module according to claim 12, wherein:

both the first substrate and the second substrate include a flexible substrate or glass.

14. The display module according to claim 1, wherein:

a transparent portion is further sandwiched with the liquid crystal between the first substrate and the second substrate; and along the direction perpendicular to the plane of the substrate, the transparent portion at least partially overlaps with the opening region, and the liquid crystal at least partially overlaps with the non-opening region.

15. The display module according to claim 14, wherein:

a transmittance of the transparent portion is greater than 95%.

16. The display module according to claim 14, wherein:

the transparent portion is made of an organic material.

17. The display module according to claim 14, wherein:

the non-opening region includes a pixel definition layer, wherein:

the transparent portion is made of a same material as the pixel definition layer, or the transparent portion is made of an optical adhesive.

18. The display module according to claim 14, further including:

a supporting pillar disposed between the first substrate and the second substrate, wherein the supporting pillar is multiplexed as the transparent portion.

19. The display module according to claim 14, further including:

a third electrode layer disposed on a side of the first substrate close to the liquid crystal, and a fourth electrode layer disposed on a side of the second substrate close to the liquid crystal, wherein:

the fourth electrode layer includes a hollow region and a fourth electrode surrounding the hollow region, and in the direction perpendicular to the plane of the substrate, the hollow region overlaps with the opening region, and the fourth electrode overlaps with the non-opening region.

20. The display module according to claim 14, wherein: in the direction perpendicular to the plane of the substrate, the opening region is located within the transparent portion.

21. A display device, comprising:

a display module, the display module including:

a substrate;

a light-emitting unit disposed on a side of the substrate, wherein the light-emitting unit includes an opening region and a non-opening region surrounding the opening region; and a transparent adjusting layer disposed on a side of the light-emitting unit away from the substrate, wherein:

the transparent adjusting layer includes a first substrate and a second substrate that are disposed opposite to each other, and a liquid crystal sandwiched between the first substrate and the second substrate, the transparent adjusting layer includes a first region and a second region surrounding the first region, in a direction perpendicular to a plane of the substrate, the first region at least partially overlaps with the opening region, and the second region at least partially overlaps with the non-opening region, and a working process of the display module includes an anti-peeping stage, and in the anti-peeping stage, the first region is transparent, and the second region is non-transparent.

* * * * *